(12) United States Patent
Wu

(10) Patent No.: US 11,474,964 B2
(45) Date of Patent: Oct. 18, 2022

(54) CONFIGURABLE INPUT/OUTPUT DEVICE AND OPERATION METHOD THEREOF

(71) Applicant: MOXA INC., New Taipei (TW)

(72) Inventor: Kun-Nan Wu, New Taipei (TW)

(73) Assignee: MOXA INC., New Taipei (TW)

( * ) Notice: Subject to any disclaimer, the term of this patent is extended or adjusted under 35 U.S.C. 154(b) by 0 days.

(21) Appl. No.: 17/082,487

(22) Filed: Oct. 28, 2020

(65) Prior Publication Data
US 2022/0129401 A1    Apr. 28, 2022

(51) Int. Cl.
*G06F 13/38* (2006.01)
*G06F 13/366* (2006.01)
*G06F 13/40* (2006.01)

(52) U.S. Cl.
CPC .......... *G06F 13/385* (2013.01); *G06F 13/366* (2013.01); *G06F 13/409* (2013.01); *G06F 13/4068* (2013.01)

(58) Field of Classification Search
CPC ... G06F 13/385; G06F 13/366; G06F 13/4068
See application file for complete search history.

(56) References Cited

U.S. PATENT DOCUMENTS

| | | | |
|---|---|---|---|
| 8,217,700 B1 * | 7/2012 | Williams | H03K 19/1732 327/333 |
| 10,031,878 B2 | 7/2018 | Stark | |
| 10,840,655 B2 | 11/2020 | Maniwa et al. | |
| 2018/0139062 A1 * | 5/2018 | Alley | G05B 9/03 |
| 2018/0189210 A1 * | 7/2018 | Ambuhl | H01L 24/18 |

FOREIGN PATENT DOCUMENTS

| | | |
|---|---|---|
| JP | 2019-028550 A | 2/2019 |
| JP | 2020-517198 A | 6/2020 |
| WO | 2018/220435 A1 | 12/2018 |

OTHER PUBLICATIONS

European Search Report dated Jun. 11, 2021, issued in application No. EP 20213661.0.
Chinese language office action dated Jul. 30, 2021, issued in application No. TW 110100578.
English language translation of Japanese office action dated Jun. 7, 2022, issued in application JP 2021-084501.

* cited by examiner

Primary Examiner — Idriss N Alrobaye
Assistant Examiner — Ronald T Modo
(74) *Attorney, Agent, or Firm* — McClure, Qualey & Rodack, LLP

(57) ABSTRACT

A configurable input/output device includes a plurality of input/output terminals, a routing module, and a first universal input/output channel. The input/output terminals are connected a plurality of field devices. The input/output terminals receive a plurality of input signals from the field devices, and output a plurality of output signals to the field devices. At least two of the input signals are different, at least two of the output signals are different, and at least two the field devices are different. The routing module is connected to the input/output terminals. The first universal input/output channel is connected to the routing module. The routing module controls connections between the first universal input/output channel and the input/output terminals. The routing module also controls the transceiving sequence for the input signals and the output signals.

12 Claims, 18 Drawing Sheets

CONFIGURABLE INPUT/OUTPUT DEVICE AND OPERATION METHOD THEREOF

TECHNICAL FIELD

The disclosure relates to an input/output device, and in particular it relates to a configurable input/output device and an operation method thereof.

BACKGROUND

In various industrial applications, high reliability redundant designs are necessary. Usually, for reliable data acquisition, multiple input/output (I/O) channels are connected to the same types of field devices to prevent a single point of failure, which implies that a redundant design is inevitably expensive. Therefore, the design of the above structure still needs to be improved.

SUMMARY

The disclosure provides a configurable input/output device, which includes a plurality of input/output terminals, a routing module, and a first universal input/output channel. The input/output terminals are connected to a plurality of field devices. The input/output terminals receive a plurality of input signals from the field devices. The input/output terminals output a plurality of output signals to the field devices, wherein at least two the input signals are different, at least two of the output signals are different, and at least two the field devices are different. The routing module is connected to the input/output terminals. The first universal input/output channel is connected to the routing module. The routing module controls connections between the first universal input/output channel and the input/output terminals. The routing module also controls the transceiving sequence for the input signals and the output signals.

The disclosure further provides an operation method of a configurable input/output device, which includes the following steps. A plurality of input/output terminals are provided to connect to a plurality of field devices for receiving a plurality of input signals from the field devices and outputting a plurality of output signals to the field devices, wherein at least two of the input signals are different, at least two of the output signals are different, and at least two of field devices are different. A routing module is provided to connect to the input/output terminals. A first universal input/output channel is provided to connect to the routing module. The routing module is used to control connections between the first universal input/output channel and the input/output terminals and a transceiving sequence for the input signals and the output signals.

BRIEF DESCRIPTION OF DRAWINGS

The disclosure can be more fully understood by reading the subsequent detailed description and examples with references made to the accompanying drawings, wherein.

DETAILED DESCRIPTION OF DISCLOSED EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, a person skilled in the art would selectively implement all or some technical features of any embodiment of the disclosure or selectively combine all or some technical features of the embodiments of the disclosure.

In each of the following embodiments, the same reference number represents the same or a similar element or component.

Figure 1:
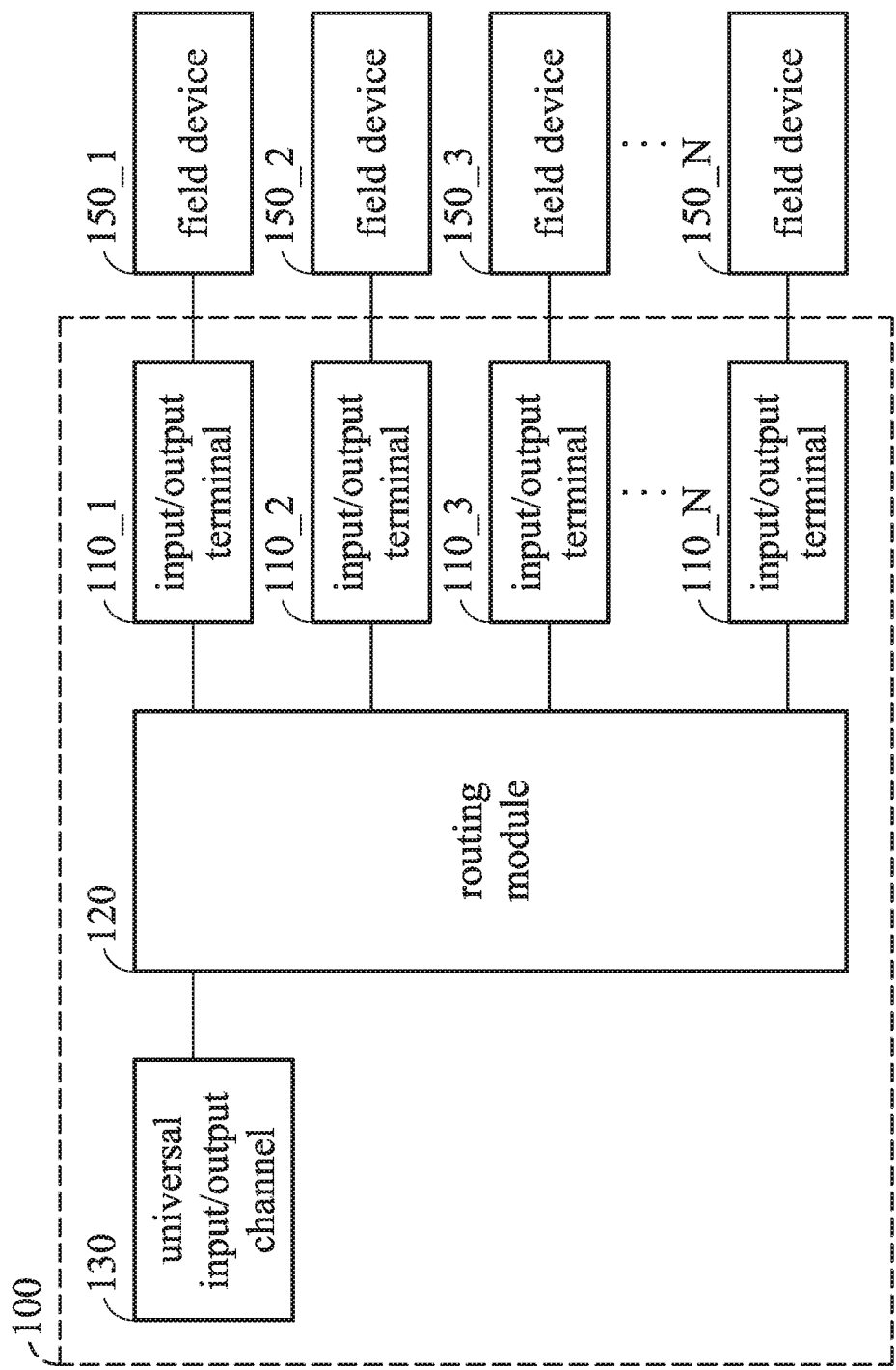
FIG. 1 is a schematic view of a configurable input/output device according to an embodiment of the disclosure.

FIG. 1 is a schematic view of a configurable input/output device according to an embodiment of the disclosure. Please refer to FIG. 1. The configurable input/output (I/O) device 100 includes a plurality of input/output terminals 110_1~110_N, a routing module 120 and an universal input/output channel 130, wherein N is a positive integer greater than 1.

The input/output terminals 110_1~110_N are connected to a plurality of field devices 150_1~150_N. For example, the input/output terminal 110_1 is connected to the field device 150_1, the input/output terminal 110_2 is connected to the field device 150_2, . . . , the input/output terminal 110_N is connected to the field device 150_N. In the embodiment, the input/output terminals 110_1~110_N includes, for example, analog input/output terminals and digital input/output terminals. For example, the input/output terminal 110_1 may be the analog input/output terminal, the input/output terminal 110_2 may be the digital input/output terminal, the input/output terminal 110_3 may be the digital input/output terminal, . . . , the input/output terminal 110_N may be the analog input/output terminal, but the embodiment of the disclosure is not limited thereto.

The input input/output terminals 110_1~110_N receive a plurality of input signals from the field devices 150_1~150_N, and output a plurality of output signals to the field devices 150_1~150_N. In the embodiment, at least two of the input signals are different. That is, at least two of the input signals generated by the field devices 150_1~150_N are different. In addition, the input signals may include analog input signals and digital input signals. For example, the input signal generated by the field device 150_1 may be the analog input signal, the input signal generated by the field device 150_2 may be the digital input signal, the input signal generated by the field device 150_3 may be the digital input signal, . . . , the input signal generated by the field device 150_N may be the analog input signal, but the embodiment of the disclosure is not limited thereto. The user may adjust the types of the input signals generated by the field devices 150_1~150_N according to the requirements thereof.

In the embodiment, at least two of the output signals are different. That is, at least two of the output signals output to the field devices 150_1~150_N are different. In addition, the output signals may include analog output signals and digital output signals. For example, the output signal output to the field device 150_1 may be the analog output signal, the output signal output to the field device 150_2 may be the digital output signal, the output signal output to the field device 150_3 may be the digital output signal, . . . , the output signal output to the field device 150_N may be the analog output signal, but the embodiment of the disclosure is not limited thereto. The user may adjust the types of the output signals generated by the field devices 150_1~150_N according to the requirements thereof.

In the embodiment, at least two of the field devices 150_1~150_N are different. In addition, the field devices 150_1~150_N may optionally include sensors, actuators or signal conditioners, but the embodiment of the disclosure is not limited thereto. For example, the field device 150_1 may be the sensor, the field device 150_2 may be the actuator, the field device 150_3 may be the signal conditioner, . . . , the field device 150_N may be the sensor, but the embodiment of the disclosure is not limited thereto. The user may adjust the types of the field devices 150_1~150_N according to the requirements thereof. Furthermore, the signal conditioners are used to amplify signals, attenuate signals, filter signals, isolate signals, etc.

The routing module 120 is connected to the input/output terminals 110_1~110_N. The universal input/output channel 130 is connected to the routing module 120. In addition, the universal input/output channel 130 may include the function of "digital to analog" conversion and "analog to digital" conversion. In the embodiment, the routing module 120 may control a connection between the universal input/output channel 130 and the input/output terminals 110_1~110_N and a time sequence for receiving the input signals from the field devices 150_1~150_N and outputting the output signals to the field devices 150_1~150_N. In the embodiment, the routing module 120 may apply, for example time division multiple access (TDMA) or the similar technology to input signals and output signals.

In the operation of the configurable input/output device 100, the routing module 120 controls the universal input/output channel 130 to connect to the input/output terminal 110_1, so that the input signal (e.g., the analog input signal) generated by the field device 150_1 (e.g., the analog sensor) may be transmitted through the input/output terminal 110_1, the routing module 120 to the universal input/output channel 130 or the output signal (e.g., the analog output signal) output to the field device 150_1 (e.g., the analog actuator) may be transmitted through the universal input/output channel 130, the routing module 120 to the input/output terminal 110_1.

Then, the routing module 120 disconnects the universal input/output channel 130 from the input/output terminal 110_1 and controls the universal input/output channel 130 to connect to the input/output terminal 110_2, so that the input signal (e.g., the digital input signal) generated by the field device 150_2 (e.g., the digital sensor) may be transmitted through the input/output terminal 110_2, the routing module 120 to the universal input/output channel 130, or the output signal (e.g., the digital output signal) output to the field device 150_2 (e.g., the digital actuator) may be transmitted through the universal input/output channel 130, the routing module 120 to the input/output terminal 110_2. The rest of the connections between the universal input/output channel 130 and the input/output terminals 110_3~110_N and the transceiving sequence for the input signals and the output signals may be similar to the embodiment described above, so this description is not repeated herein.

Therefore, the configurable input/output device 100 may be connected to various types of the field devices 150_1~150_N through the input/output terminals 110_1~110_N at the same, and the input/output terminals 110_1~110_N (the field devices 150_1~150_N) may share the same universal input/output channel 130, thereby decreasing the complexity of the circuit design and increasing the convenience of use.

Figure 2:
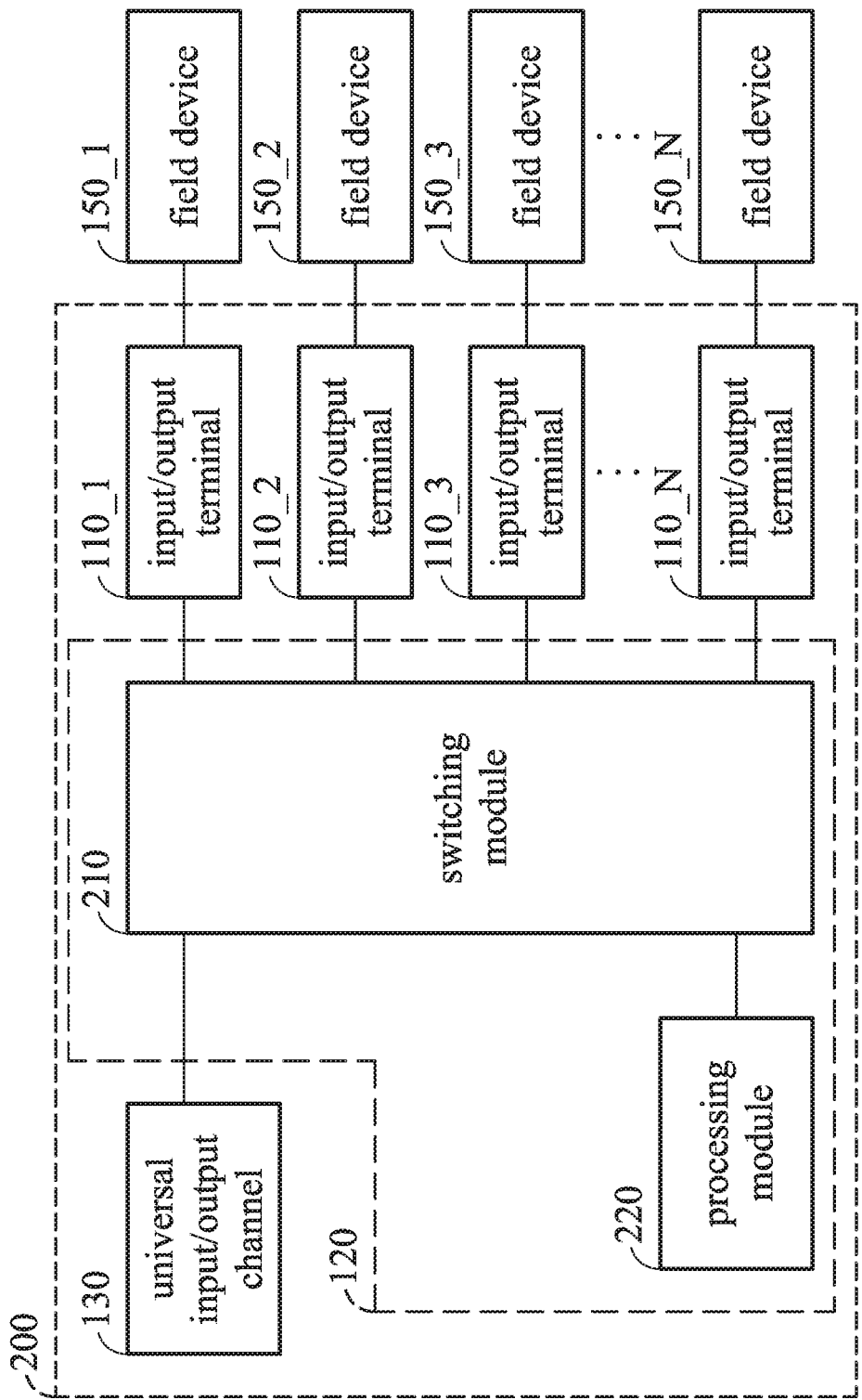
FIG. 2 is a schematic view of a configurable input/output device according to another embodiment of the disclosure.

FIG. 2 is a schematic view of a configurable input/output device according to another embodiment of the disclosure. Please refer to FIG. 2. The configurable input/output device 200 is similar to the configurable input/output device 100 of FIG. 1. In FIG. 2, the input/output terminals 110_1~110_N, the universal input/output channel 130 and the field devices 150_1~150_N are equal to or similar to the input/output terminals 110_1~110_N, the universal input/output channel 130 and the field devices 150_1~150_N. Accordingly, the input/output terminals 110_1~110_N, the universal input/output channel 130 and the field devices 150_1~150_N of FIG. 2 may refer to the embodiment of FIG. 1, and the description thereof is not repeated herein.

In the embodiment, the routing module 120 includes a switching module 210 and a processing module 220. The switching module 210 is connected to the universal input/output channel 130 and the input/output terminals 110_1~110_N. In the embodiment, the switching module 210 may be, for example, a multiplexer, but the embodiment of the disclosure is not limited thereto.

The processing module 220 is connected to the switching module 210. In the embodiment, the processing module 220 may be a micro-processer or a micro-controller, but the embodiment of the disclosure is not limited thereto. The processing module 220 may receive a setting signal and generates control signal according to the setting signal to control the switching module 210 and the transceiving sequence for the input signals and the output signals, so that the switching module 210 may switch the connections between the universal input/output channel 130 and the input/output terminals 110_1~110_N.

In the embodiment, the setting signal may include, for example, a switching sequence corresponding to the switching module 210 and the transceiving sequence for the input signals and the output signals, but the embodiment of the disclosure is not limited thereto. In some embodiment, the setting signal may be provided by an external processing module (not shown), e.g., the processing module 220 may receive the setting signal from the external processing module to generate the control signal. In some embodiment, the setting signal may be provided through the universal input/output channel 130 or other transmission lines (not shown), e.g., the processing module 220 may receive the setting signal from the universal input/output channel 130 or other transmission lines to generate the control signal. In some embodiment, the processing module 220 may be omitted, the switching module 210 may be controlled by an external processing module.

In the operation of the routing module 120, the processing module 220 may first disconnect the switching module 210 from the universal input/output channel 130. Then, the processing module 220 may receive the setting signal from the universal input/output channel 130 and generate the control signal according to the setting signal. Afterward, the processing module 220 may disconnect from the universal input/output channel 130. The processing module 220 may transmit the control signal to the switching module 210 to control the switching module 210, so that the switching module 210 may switch the connections between the universal input/output channel 130 and the input/output terminals 110_110_N, and the input signals and the output signals are sequentially transceived through the universal input/output channel 130, the switching module 210, and the input/output terminals 1101~110_N.

In the operation of the configurable input/output device 200, the switching module 210 may switches to connect the universal input/output channel 130 to the input/output terminal 110_1, so that the input signal (e.g., the analog input signal) generated by the field device 150_1 (e.g., the analog sensor) may be transmitted through the input/output terminal 110_1, the switching module 210 to the universal input/output channel 130 or the output signal (e.g., the analog output signal) output to the field device 150_1 (e.g., the analog actuator) may be transmitted through the universal input/output channel 130, the switching module 210 to the input/output terminal 110_1.

Then, the switching module 210 may switch to disconnect the universal input/output channel 130 from the input/output terminal 110_1 and to connect the universal input/output channel 130 to the input/output terminal 110_2, so that the input signal (e.g., the digital input signal) generated by the field device 150_2 (e.g., the digital sensor) may be transmitted through the input/output terminal 110_2, the switching module 210 to the universal input/output channel 130 and then the output signal (e.g., the digital output signal) output to the field device 150_2 (e.g., the digital actuator) may be transmitted through the universal input/output channel 130, the switching module 210 to the input/output terminal 110_2. The rest of the connections between the universal input/output channel 130 and the input/output terminals 110_3~110_N and the transceiving sequence for the input signals and the output signals may be similar to the embodiment described above, so this description is not repeated herein.

Therefore, the configurable input/output device 100 may be connected to various types of the field devices 150_1~150_N through the input/output terminals 110_1~110_N at the same, and the input/output terminals 110_1~110_N (the field devices 150_1~150_N) may share the same universal input/output channel 130, thereby decreasing the complexity of the circuit design and increasing the convenience of use.

Figure 3A:
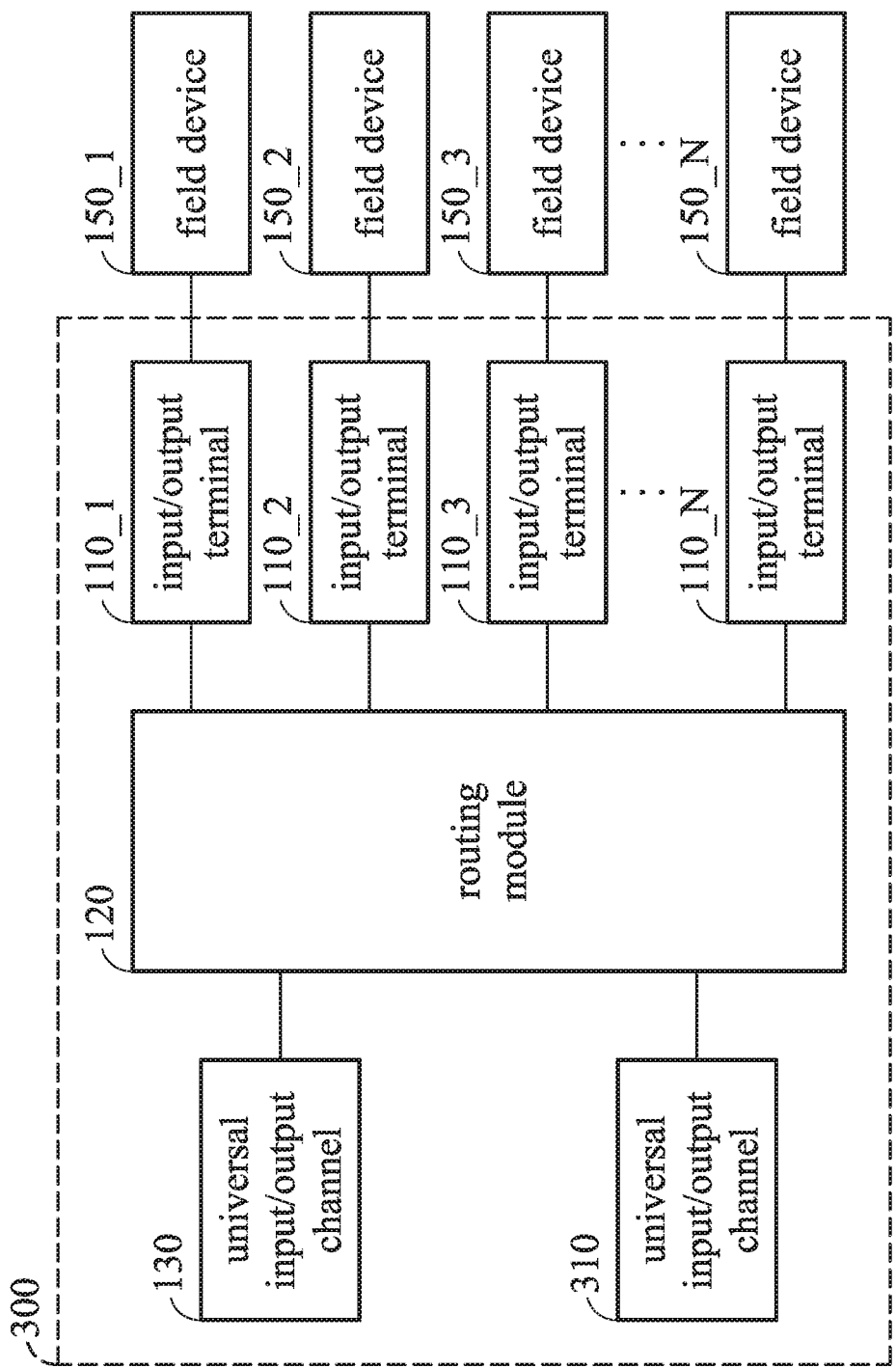
FIG. 3A is a schematic view of a configurable input/output device according to another embodiment of the disclosure.

FIG. 3A is a schematic view of a configurable input/output device according to another embodiment of the disclosure. The configurable input/output device 300 includes a plurality of input/output terminals 110_1~110_N, a routing module 120, a universal input/output channel 130 and an universal input/output channel 310. In the embodiment, the input/output terminals 110_1~110_N, the universal input/output channel 130 and the field devices 150_1~150_N are equal to or similar to the input/output terminals 110_1~110_N, the universal input/output channel 130 and the field devices 150_1~150_N of FIG. 1. Accordingly, the input/output terminals 110_1~110_N, the universal input/output channel 130 and the field devices 150_1~150_N of FIG. 3A may refer to the embodiment of FIG. 1, and the description thereof is not repeated herein.

The universal input/output channel 310 is connected to the routing module 120. In addition, the universal input/output channel 310 may also include the function of data extraction, "digital to analog" conversion and "analog to digital" conversion. The routing module 120 may control the connections between universal input/output channel 130 and the input/output terminals 110_1~110_N and connections between the universal input/output channel 310 and the input/output terminals 110_1~110_N at the same time.

Figure 3B:
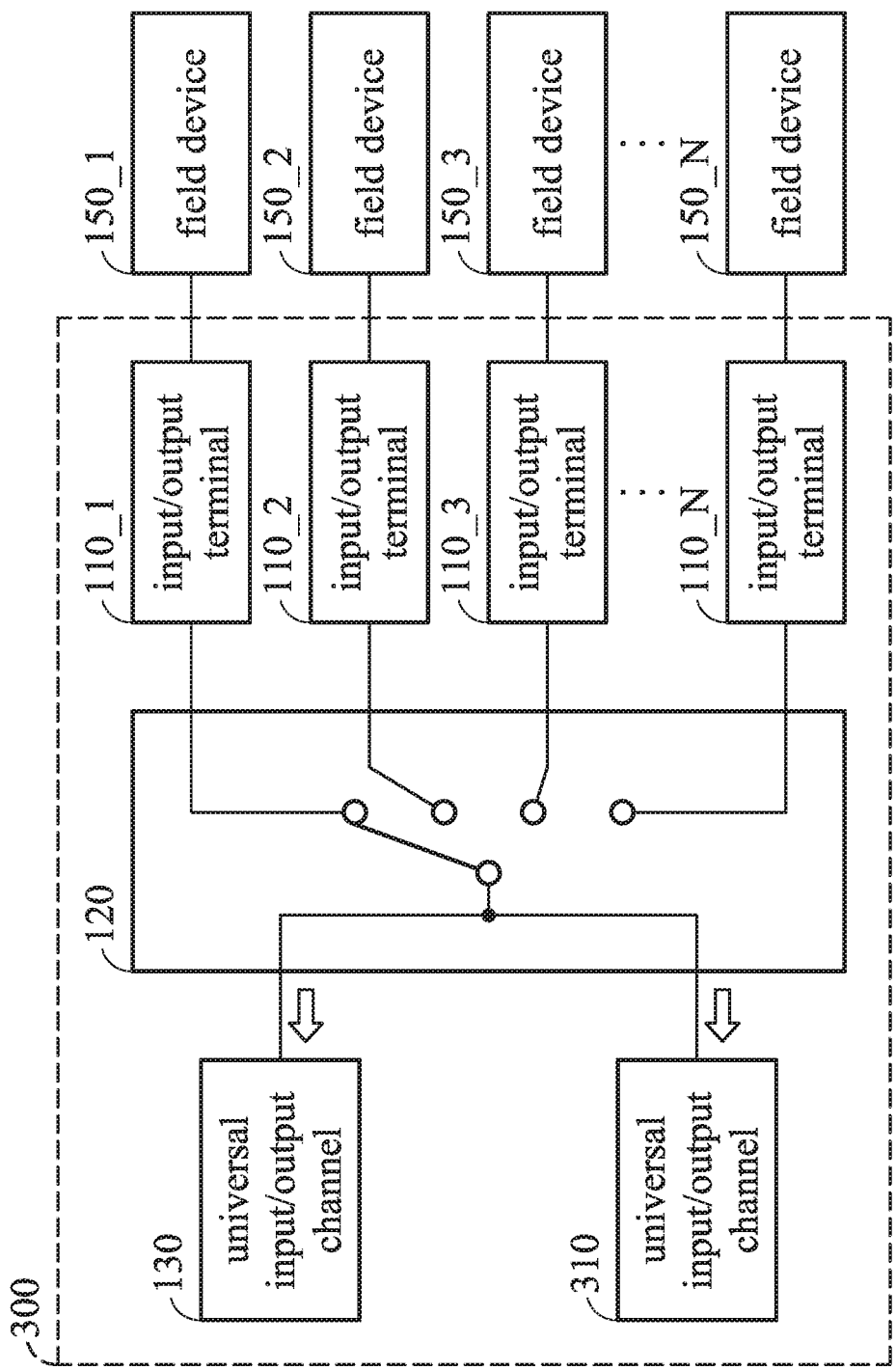
FIG. 3B is a schematic view of a configurable input/output device according to another embodiment of the disclosure.

As shown in FIG. 3B, assuming that the field devices 150_1, 150_3, . . . , 150_N–1 are the analog sensors, and the field devices 150_2, 150_4, . . . , 150_N are the digital sensors. In this embodiment, the routing module 120 controls the universal input/output channel 130 and the universal input/output channel 310 to connect to the input/output terminal 110_1 at the same time, so that the input signal (e.g., the analog input signal) generated by the field device 150_1 (e.g., the analog sensor) may be transmitted to the universal input/output channel 130 and the universal input/output channel 310 at the same time.

Then, the routing module 120 disconnects the universal input/output channel 130 and the universal input/output channel 310 from the input/output terminal 110_1 and controls the universal input/output channel 130 and the universal input/output channel 310 to connect to the input/output terminal 110_2 at the same time, so that the input signal (e.g., the digital input signal) generated by the field device 150_2 (e.g., the digital sensor) may be transmitted to the universal input/output channel 130 and the universal input/output channel 310 at the same time. The rest of the connections between the universal input/output channel 130 and the universal input/output channel 310 and the input/output terminals 110_3~110_N and the transmission sequence for the input signals may be similar to the embodiment described above, so this description is not repeated herein.

Therefore, the universal input/output channel 130 and the universal input/output channel 310 may receive the same types of the input signals at the same time, so that the configurable input/output device 300 may achieve a redundant function.

Figure 3C:
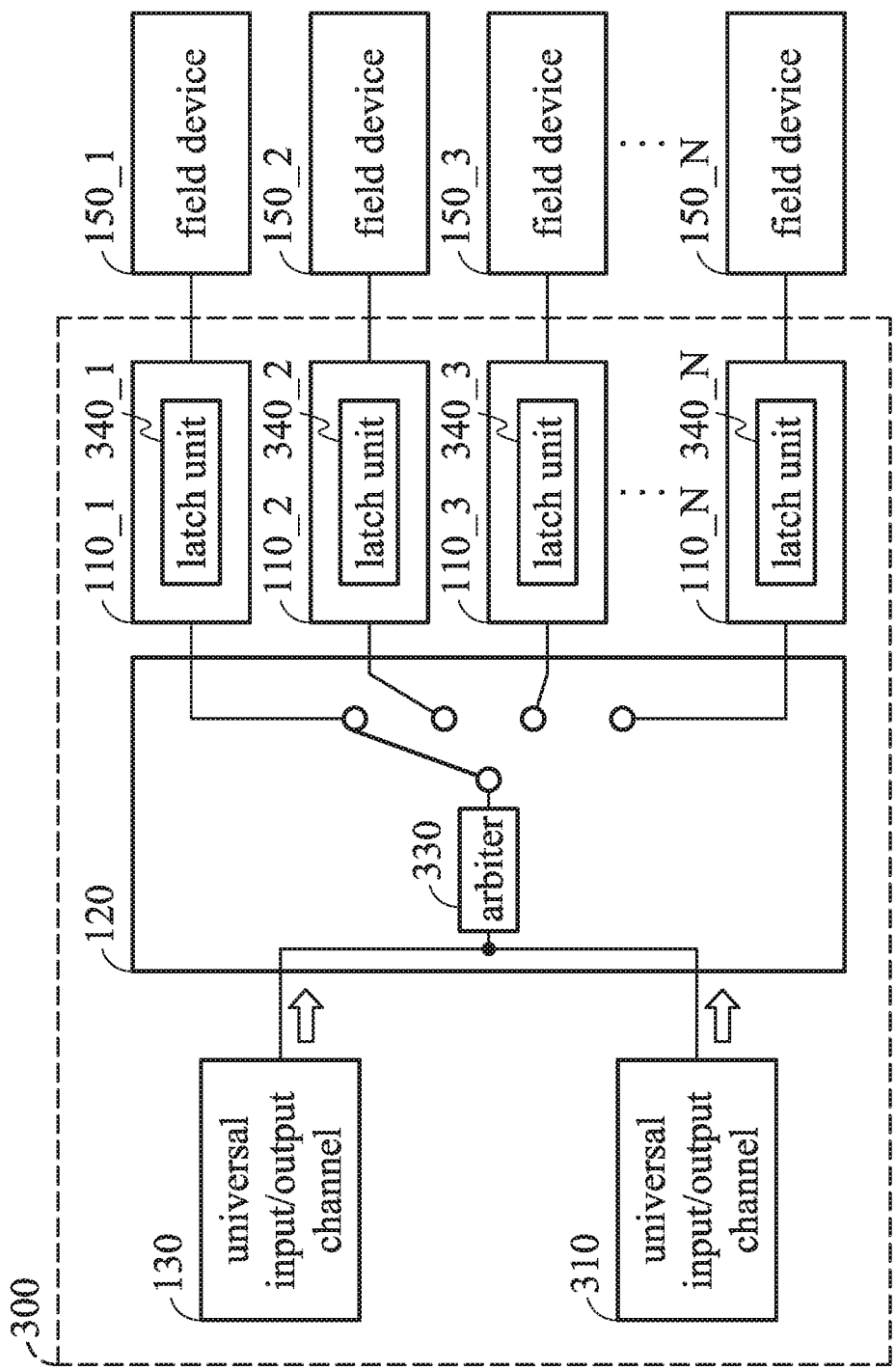
FIG. 3C is a schematic view of a configurable input/output device according to another embodiment of the disclosure.

As shown in FIG. 3C, assuming that the field devices 150_1, 150_3, . . . , 150_N−1 are the analog actuators, and the field devices 150_2, 150_4, . . . , 150_N are the digital actuators. In the embodiment, the routing module 120 may further include an arbiter 330, and the input/output terminals 110_1~110_N may further include latch units 340_1~340_N. In this embodiment, the routing module 120 controls the universal input/output channel 130 and the universal input/output channel 310 to connect to the input/output terminal 110_1 at the same time, the universal input/output channel 130 and the universal input/output channel 310 may output the output signals (e.g., the analog output signals) to the arbiter 330 at the same time. Then, the arbiter 330 may select the output signal from the universal input/output channel 130 or the universal input/output channel 310 and transmit the output signal to the field device 150_1 (e.g., analog actuator), so as to drive the field device 150_1.

Afterward, the routing module 120 disconnects the universal input/output channel 130 and the universal input/output channel 310 and from input/output terminal 110_1 and controls the universal input/output channel 130 and the universal input/output channel 310 to connect to the input/output terminal 110_2 at the same time, the universal input/output channel 130 and the universal input/output channel 310 may output the output signals (e.g., the digital output signals) to the arbiter 330 at the same time. Then, the arbiter 330 may select the output signal from the universal input/output channel 130 or the universal input/output channel 310 and transmit the output signal to the field device 150_2 (e.g., digital actuator), so as to drive the field device 150_2. At this time, since the input/output terminal 110_1 includes the latch unit 340_1, the latch unit 340_1 may maintain the output status of the output signal output to the field device 150_1.

The rest of the connections between the universal input/output channel 130 and the universal input/output channel 310 and the input/output terminals 110_3~110_N and the transmission sequence for the output signals may be similar to the embodiment described above, so this description is not repeated herein. Therefore, the universal input/output channel 130 and the universal input/output channel 310 may transmit the same types of the output signals at the same time, so that the configurable input/output device 300 may achieve the redundant function.

Figure 3D:
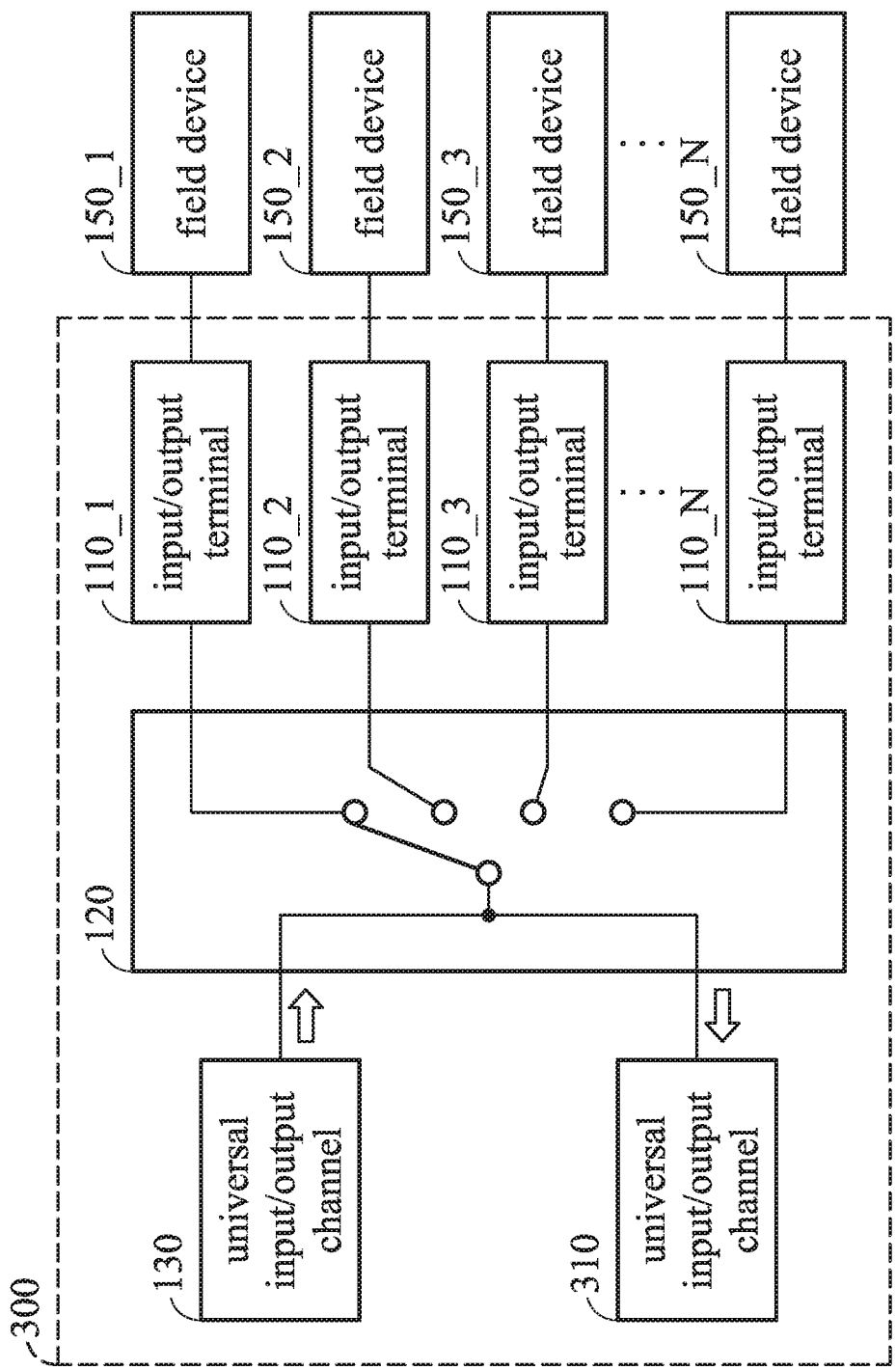
FIG. 3D is a schematic view of a configurable input/output device according to another embodiment of the disclosure.

As shown in FIG. 3D, assuming that the field devices 150_1, 150_3, . . . , 150_N−1 are the analog actuators, and the field devices 150_2, 150_4, . . . , 150_N are the digital actuators. In this embodiment, the routing module 120 controls the universal input/output channel 130 and the universal input/output channel 310 to connect to the input/output terminal 110_1 at the same time. At this time, the universal input/output channel 130 may turn to be the analog output channel, and the universal input/output channel 310 may turn to be the analog input channel. Then, the universal input/output channel 130 may output the output signal (e.g., the analog output signal) to the field device 150_1 (e.g., the analog actuator), so as to drive the field device 150_1. Simultaneously, the universal input/output channel 130 may also output the output signal to the universal input/output channel 310, so that the output signal of the universal input/output channel 130 may be diagnosed by the universal input/output channel 310.

Afterward, the routing module 120 disconnects the universal input/output channel 130 and the universal input/output channel 310 from the input/output terminal 110_1 and controls the universal input/output channel 130 and the universal input/output channel 310 to connect to the input/output terminal 110_2 at the same time. At this time, the universal input/output channel 130 may turn to be the digital output channel, and the universal input/output channel 310 may turn to be the digital input channel. Then, the universal input/output channel 130 may output the output signal (e.g., the digital output signal) to the field device 150_2 (e.g., the digital actuator), so as to drive the field device 150_2. Simultaneously, the universal input/output channel 130 may also output the output signal to the universal input/output channel 310, so that the output signal of the universal input/output channel 130 may be diagnosed by the universal input/output channel 310.

The rest of the connections between the universal input/output channel 130 and the universal input/output channel 310 and the input/output terminals 110_3~110_N and the transmission sequence for the output signals may be similar to the embodiment described above, so this description is not repeated herein. The configurable input/output device 300 may achieve the diagnosed function.

Figure 3E:
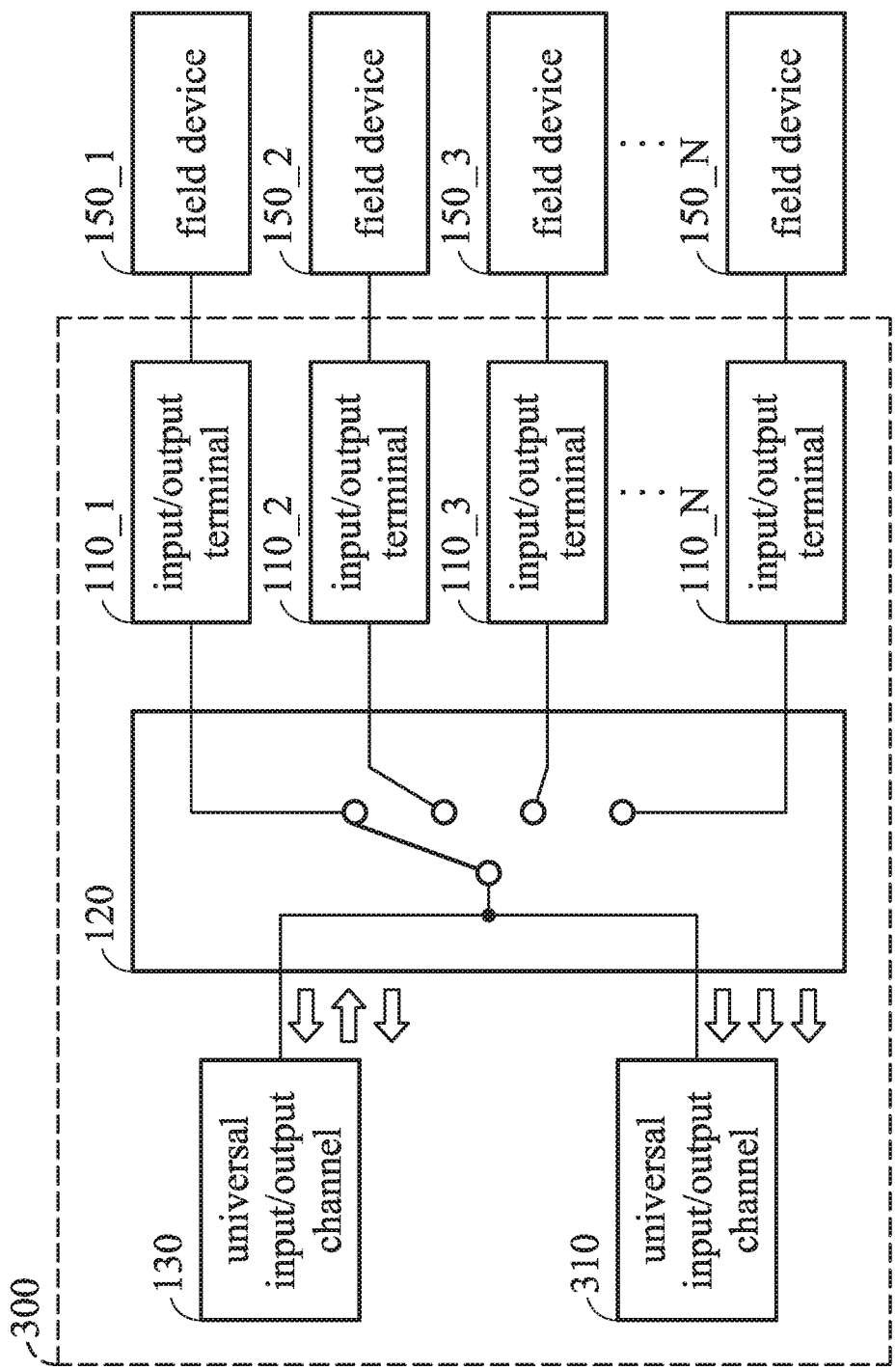
FIG. 3E is a schematic view of a configurable input/output device according to another embodiment of the disclosure.

As shown in FIG. 3E, assuming that the field devices 150_1, 150_3, . . . , 150_N<1 are the analog sensors or the digital sensors, and the field devices 150_2, 150_4, . . . , 150_N are the analog actuators or the digital actuators. In this embodiment, the routing module 120 controls the universal input/output channel 130 and the universal input/output channel 310 to connect to the input/output terminal 110_1 at the same time. At this time, the universal input/output channel 130 and the universal input/output channel 310 may turn to be the input channel (e.g., the analog input channel or the digital input channel), so that the input signal (e.g., the analog input signal or the digital input signal) generated by the field device 150_1 (e.g., the analog sensor or the digital sensor) may be transmitted to the universal input/output channel 130 and the universal input/output channel 310 at the same time.

Afterward, the routing module 120 disconnects the universal input/output channel 130 and the universal input/output channel 310 from the input/output terminal 110_1 and controls the universal input/output channel 130 and the universal input/output channel 310 to connect to the input/output terminal 110_2 at the same time. At this time, the universal input/output channel 130 may turn to be the output channel (e.g. the analog output channel or the digital output channel), and the universal input/output channel 310 may turn to be the input channel (e.g., the analog input channel or the digital input channel). Then, the universal input/output channel 130 may output the output signal (e.g., the analog output signal or the digital signal) to the field device 150_2 (e.g., the analog actuator or digital actuator), so as to drive the field device 150_2. Simultaneously, the universal input/output channel 130 may also output the output signal to the universal input/output channel 310, so that the output signal of the universal input/output channel 130 may be diagnosed by the universal input/output channel 310.

The rest of the connections between the universal input/output channel 130 and the universal input/output channel 310 and the input/output terminals 110_3~110_N and the transceiving sequence for the input signals and the output signals may be similar to the embodiment described above, so this description is not repeated herein. The configurable input/output device 300 may achieve the diagnosed and redundant function.

Figure 3F:
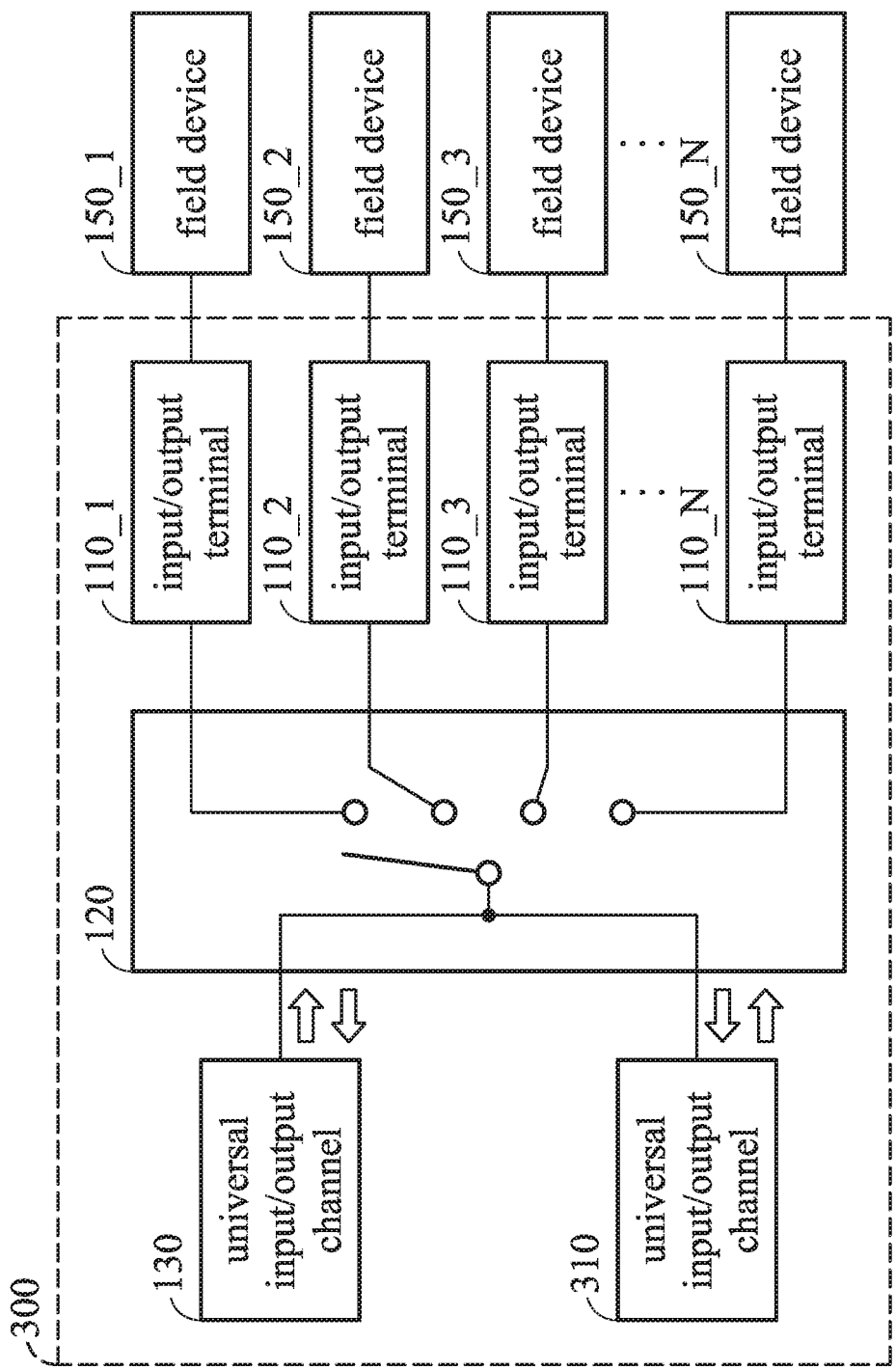
FIG. 3F is a schematic view of a configurable input/output device according to another embodiment of the disclosure.

As shown in FIG. 3F, the routing module 120 controls the universal input/output channel 130 to connect to the universal input/output channel 310. At this time, the universal input/output channel 130 may turn to be the output channel (e.g., the analog output channel or the digital output channel), and the universal input/output channel 310 may turn to be the input channel (e.g., the analog input channel or digital input channel). Then, the universal input/output channel 130 may output the output signal (e.g., the analog output signal or the digital output signal) to the universal input/output channel 310, so that the output signal of the universal input/output channel 130 may be diagnosed by the universal input/output channel 310.

Afterward, the universal input/output channel 130 may turn to be the input channel (e.g., the analog input channel or the digital input channel), and the universal input/output channel 310 may turn to be the output channel (e.g., the analog output channel or digital output channel). Then, the universal input/output channel 310 may output the output signal (e.g., the analog output signal or the digital output signal) to the universal input/output channel 130, so that the output signal of the universal input/output channel 310 may be diagnosed by the universal input/output channel 310.

Therefore, the universal input/output channel 130 and the universal input/output channel 310 may be diagnosed by each other in case no changes of input status for a long run, so that the configurable input/output device 300 may achieve the diagnosed function.

In above embodiments, the configurable input/output device 300 includes two universal input/output channels (e.g., the universal input/output channel 130 and the universal input/output channel 310), but the embodiment of the disclosure is not limited thereto. In some embodiments, the configurable input/output device 300 may include three or more universal input/output channels, the three or more universal input/output channels may refer to the above embodiment of the universal input/output channel 130 and the universal input/output channel 310, and the description thereof is not repeated herein. Accordingly, the same effect may also be achieved.

Figure 4A:
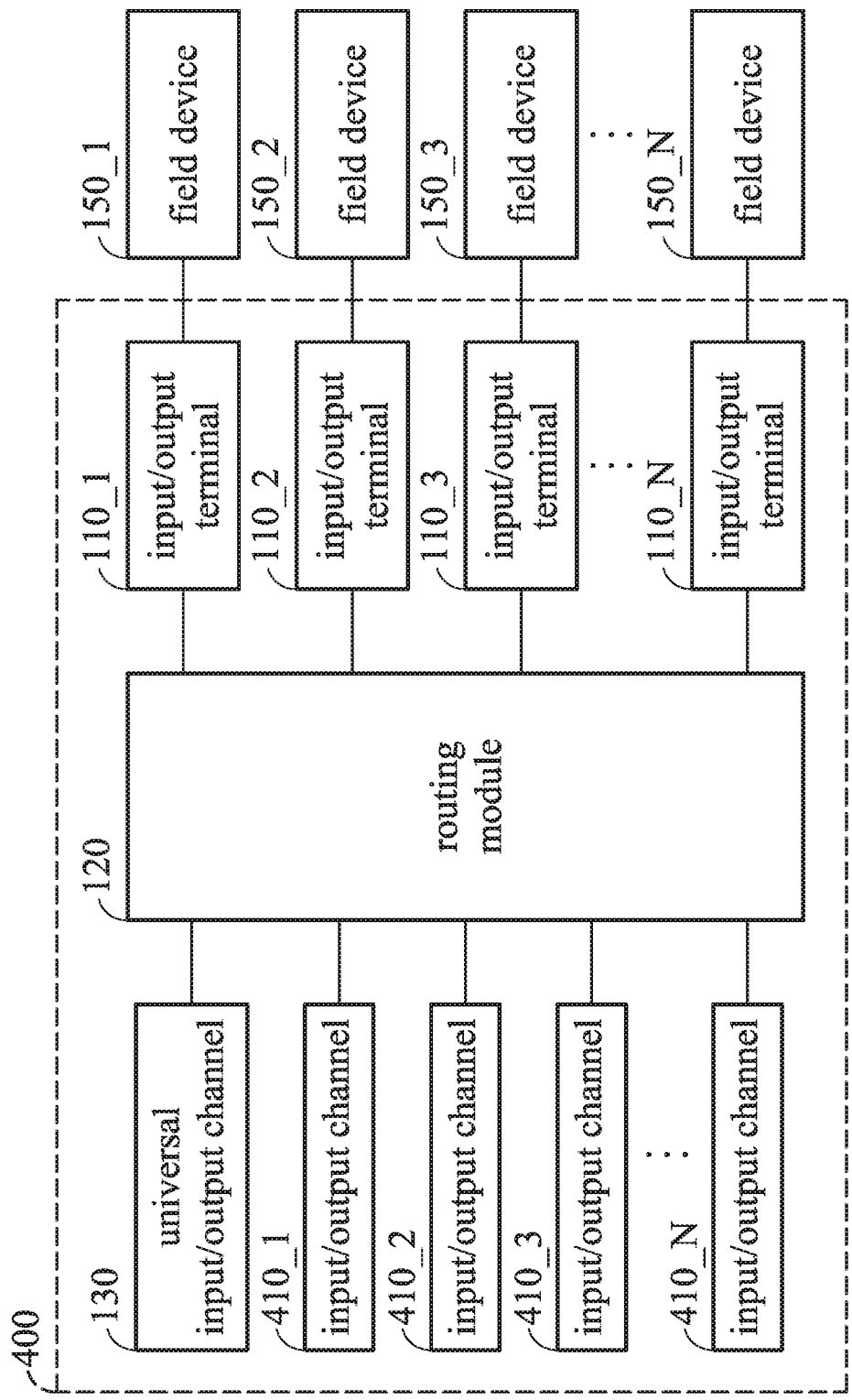
FIG. 4A is a schematic view of a configurable input/output device according to another embodiment of the disclosure.

FIG. 4A is a schematic view of a configurable input/output device according to another embodiment of the disclosure. The configurable input/output device 400 includes a plurality of input/output terminals 110_1~110_N, a routing module 120, a universal input/output channel 130, a plurality of input/output channels 410_1~410_N. In the embodiment, the input/output terminals 110_1~110_N, the universal input/output channel 130 and the field devices 150_1~150_N are equal to or similar to the input/output terminals 110_1~110_N, the universal input/output channel 130 and the field devices 150_1~150_N of FIG. 1. Accordingly, the input/output terminals 110_1~110_N, the universal input/output channel 130 and the field devices 150_1~150_N of FIG. 4A may refer to the embodiment of FIG. 1, and the description thereof is not repeated herein.

The input/output channels 410_1~410_N are connected to the routing module 120 and correspond to the input/output terminals 110_1~110_N. For example, the input/output channel 410_1 corresponds to the input/output terminal 110_1, the input/output channel 410_2 corresponds the input/output terminal 110_2, the input/output channel 410_3 corresponds the input/output terminal 110_3, . . . , the input/output channel 410_N corresponds to the input/output terminal 110_N. In the embodiment, the input/output channels 410_1~410_N may include, for example, the analog input/output channels and the digital input/output channels. For example, the input/output channel 410_1 may be the analog input/output channel, the input/output channel 410_2 may be the digital input/output channel, the input/output channel 410_3 may be the digital input/output channel, . . . , the input/output channel 410_N may be the analog input/output channel, but the embodiment of the disclosure is not limited thereto.

The routing module 120 may control the connections between the universal input/output channel 130 and the input/output channels 410_1~410_N and corresponding connections between the input/output terminals 110_1~110_N and the input/output channels at the same time.

Figure 4B:
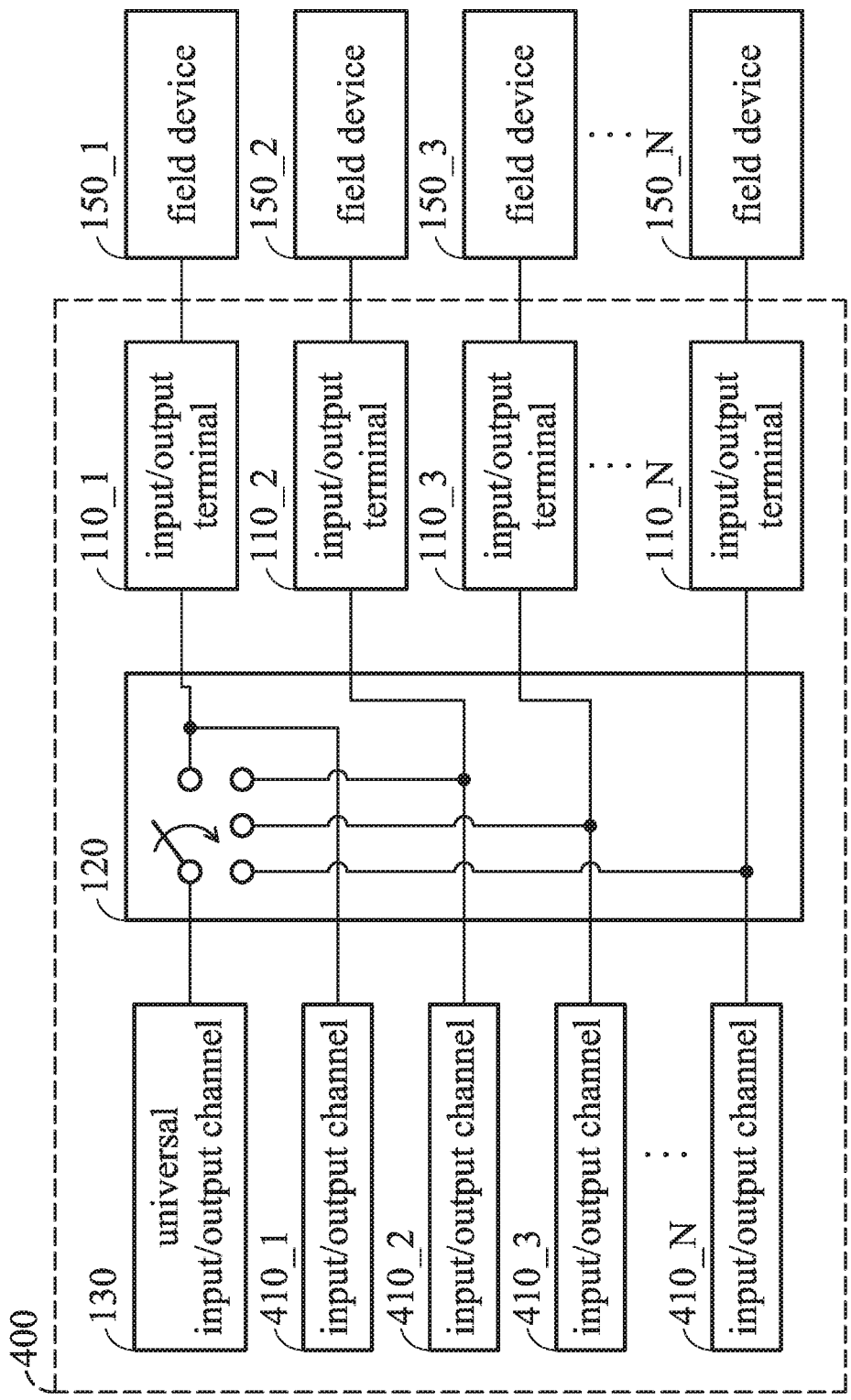
FIG. 4B is a schematic view of a configurable input/output device according to another embodiment of the disclosure.

As shown in FIG. 4B, assuming that the field devices 150_1, 150_3, 150_N−1 are the analog sensors, and the field devices 150_1, 150_3, . . . , 150_N−1 are the digital sensors. The input/output channels 410_1~410_N are respectively connected to the input/output terminals 110_1~110_N through the routing module 120. In this embodiment, the routing module 120 controls the universal input/output channel 130 to connect to the input/output terminal 110_1. At this time, the universal input/output channel 130 may turn to be the analog input channel. Then, the input signal (e.g., the analog input signal) generated by the field device 150_1 (e.g., the analog sensor) may be transmitted to the universal input/output channel 130 and the input/output channel 410_1 at the same time.

Afterward, the routing module 120 disconnects the universal input/output channel 130 from the input/output terminal 110_1 and controls the universal input/output channel 130 to connect to the input/output terminal 110_2. At this time, the universal input/output channel 130 may turn to be the digital input channel. Then, the input signal (e.g., the digital input signal) generated by the field device 150_2 (e.g., the digital sensor) may be transmitted to the universal input/output channel 130 and the input/output channel 410_2 at the same time.

The rest of the connections between the universal input/output channel 130 and the input/output terminals 110_3~110_N and the transmission sequence for the input signals may be similar to the embodiment described above, so this description is not repeated herein. Therefore, the universal input/output channel 130 and one of the input/output channels 410_1~410_N may receive the same types of the input signals at the same time, so that the configurable input/output device 400 may also achieve the redundant function, and the convenience of use may be increased.

Figure 4C:
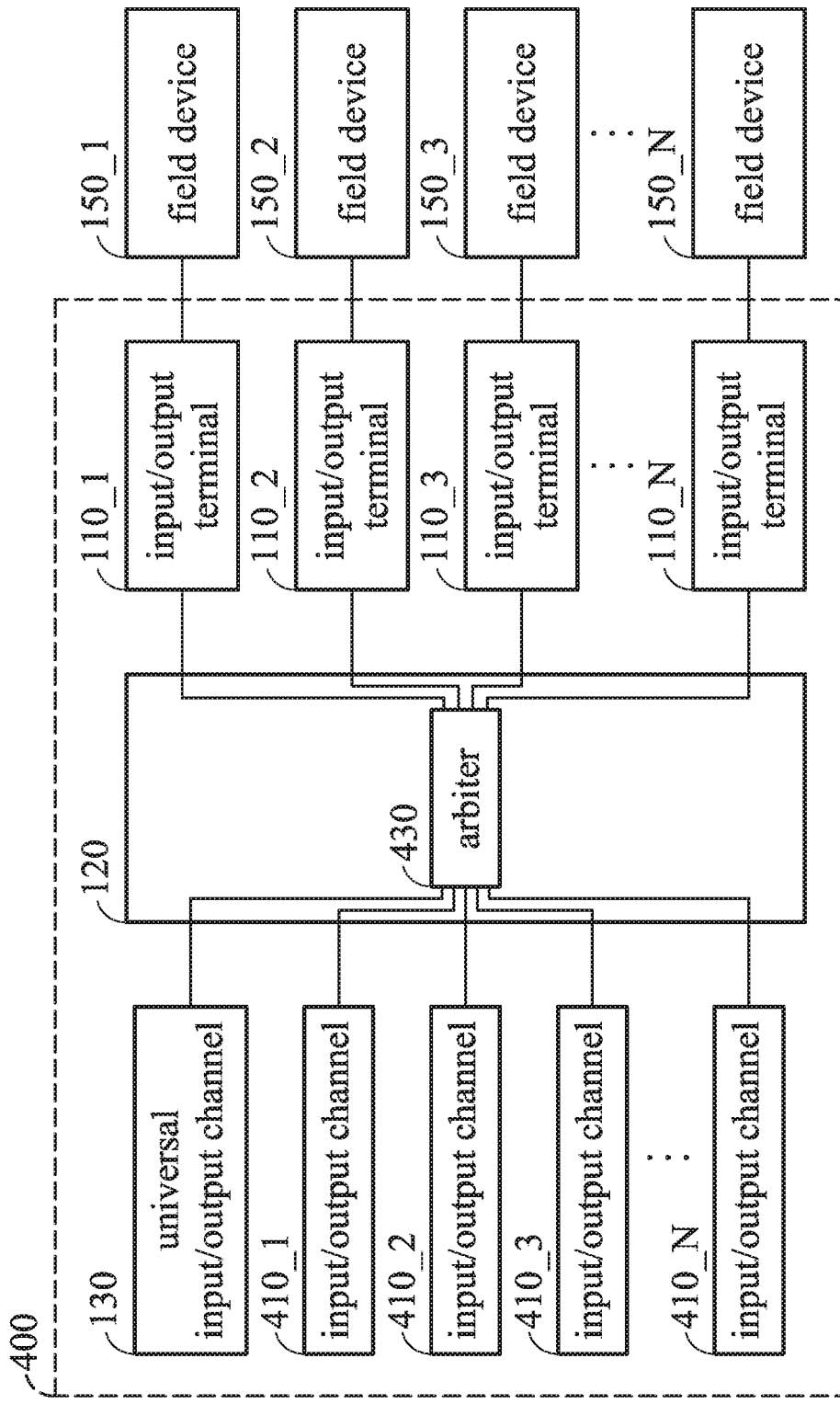
FIG. 4C is a schematic view of a configurable input/output device according to another embodiment of the disclosure.

As shown in FIG. 4C, assuming that the field devices 150_1, 150_3, . . . , 150_N−1 are the analog actuators, and the field devices 150_2, 150_4, . . . , 150_N are the digital actuators. In the embodiment, the routing module 120 may further include an arbiter 430. The input/output channels 410_1~410_N are respectively connected to the input/output terminals 110_1~110_N through the routing module 120. In this embodiment, the routing module 120 controls the universal input/output channel 130 to connect to the input/output terminal 110_1. At this time, the universal input/output channel 130 may turn to be the analog output terminal. Then, the universal input/output channel 130 and the input/output channel 410_1 may output the output signals (e.g., the analog output signals) to the arbiter 430 at the same time. Afterward, the arbiter 430 may select the output signal from the universal input/output channel 130 or the input/output channel 410_1 and transmit the output signal to the field device 150_1 (e.g., analog actuator or the analog signal conditioner), so as to drive the field device 150_1.

Then, the routing module 120 disconnects the universal input/output channel 130 from the input/output terminal 110_1 and controls the universal input/output channel 130 to connect to the input/output terminal 110_2. At this time, the universal input/output channel 130 may turn to be the digital output terminal. Then, the universal input/output channel 130 and the input/output channel 410_2 may output the output signals (e.g., the digital output signals) to the arbiter 430 at the same time. Afterward, the arbiter 430 may select the output signal from the universal input/output channel 130 or the input/output channel 410_2 and transmit the output signal to the field device 150_2 (e.g., digital actuator), so as to drive the field device 150_2.

The rest of the connections between the universal input/output channel 130 and the input/output terminals 110_3~110_N and the transmission sequence for the output signals may be similar to the embodiment described above, so this description is not repeated herein. Therefore, the universal input/output channel 130 and one of the input/output channels 410_1~410_N may transmit the same types of the output signals at the same time, so that the configurable input/output device 400 may achieve the redundant function.

Figure 4D:
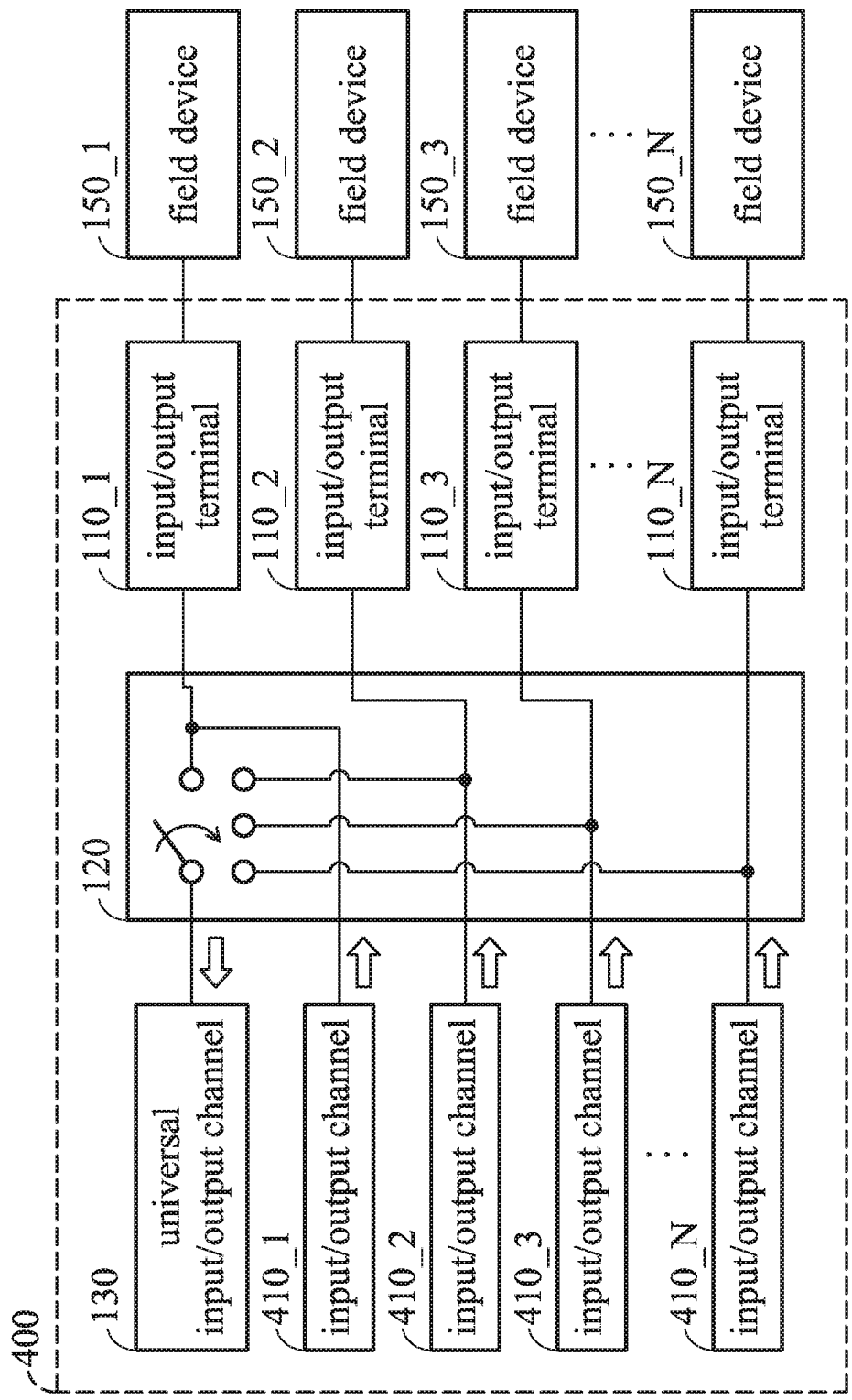
FIG. 4D is a schematic view of a configurable input/output device according to another embodiment of the disclosure.

As shown in FIG. 4D, assuming that the field devices 150_1, 150_3, . . . , 150_N−1 are the analog actuators, and the field devices 150_2, 150_4, . . . , 150_N are the digital actuators. The input/output channels 410_1~410_N are respectively connected to the input/output terminals 110_1~110_N through the routing module 120. In this embodiment, the routing module 120 controls the universal input/output channel 130 to connect to the input/output terminal 110_1. At this time, the universal input/output channel 130 may turn to be the analog input channel. Then, the input/output channel 410_1 may output the output signal (e.g., the analog output signal) to the field device 150_1 (e.g., the analog actuator), so as to drive the field device 150_1. Simultaneously, the input/output channel 410_1 may also output the output signal to the universal input/output channel 130, so that the output signal of the input/output channel 410_1 may be diagnosed by the universal input/output channel 130.

Afterward, the routing module 120 disconnects the universal input/output channel 130 from the input/output terminal 110_1 and controls the universal input/output channel 130 to connect to the input/output terminal 110_2. At this time, the universal input/output channel 130 may turn to be the digital input channel. Then, the input/output channel 410_2 may output the output signal (e.g., the digital output signal) to the field device 150_2 (e.g., the digital actuator), so as to drive the field device 150_2. Simultaneously, the input/output channel 410_2 may also output the output signal to the universal input/output channel 130, so that the output signal of the input/output channel 410_2 may be diagnosed by the universal input/output channel 130.

The rest of the connections between the universal input/output channel 130 and the input/output terminals 110_3~110_N and the transmission sequence for the output signals may be similar to the embodiment described above, so this description is not repeated herein. The configurable input/output device 400 may achieve the diagnosed and redundant function.

Figure 4E:
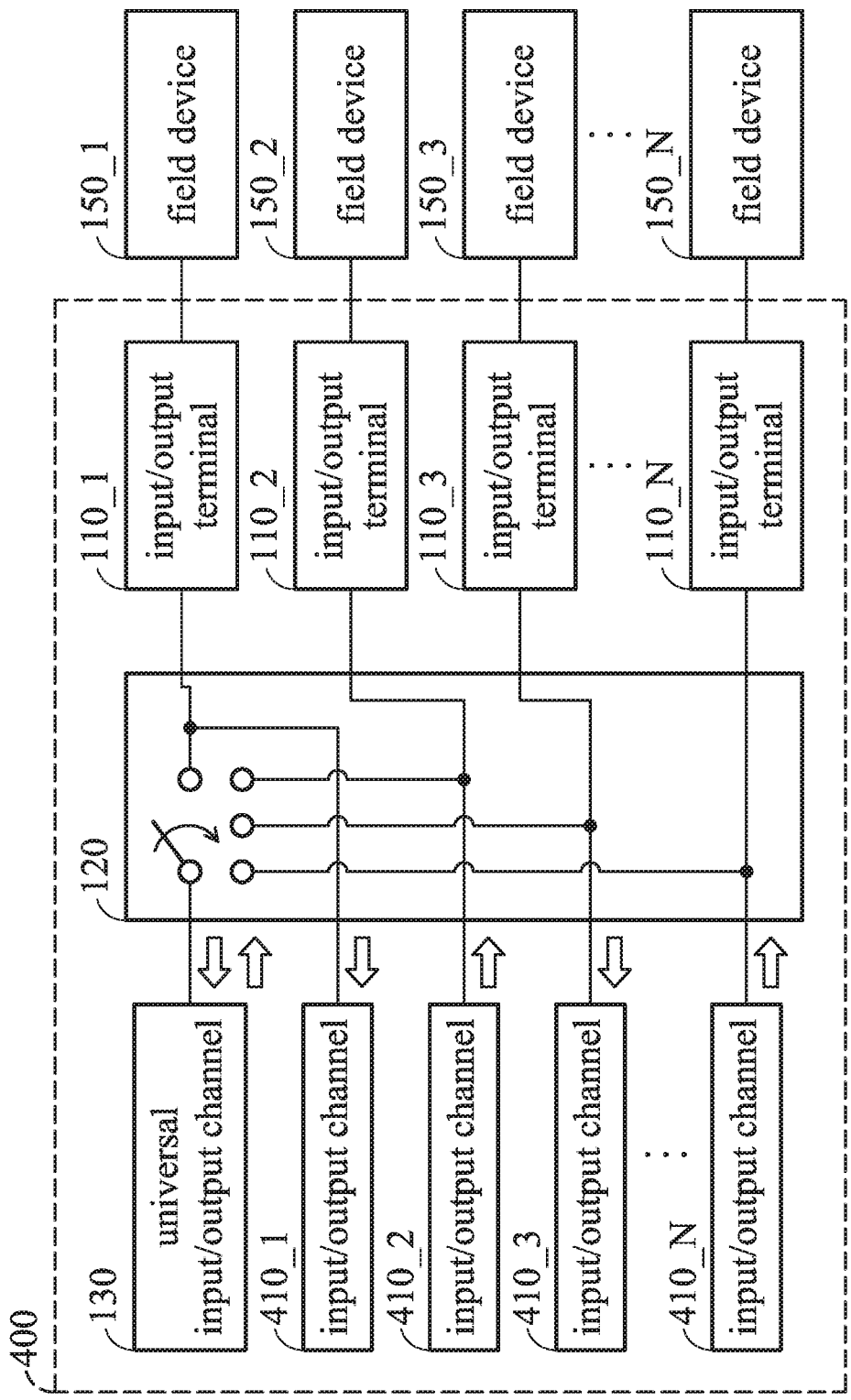
FIG. 4E is a schematic view of a configurable input/output device according to another embodiment of the disclosure.

As shown in FIG. 4E, assuming that the field devices 150_1, 150_3, . . . , 150_N−1 are the analog sensors or the digital sensors, and the field devices 150_2, 150_4, . . . , 150_N are the analog actuators or the digital actuators. The input/output channels 410_1~410_N are respectively connected to the input/output terminals 110_1~110N through the routing module 120. In this embodiment, the routing module 120 controls the universal input/output channel 130 to connect to the input/output terminal 110_1. At this time, the universal input/output channel 130 may be turn to be the input channel (e.g. the analog input channel or the digital input channel). Then, the input signal (e.g., the analog input signal or the digital input signal) generated by the field device 150_1 (e.g., the analog sensor or the digital sensor) may be transmitted to the universal input/output channel 130 and the input/output channel 410_1 at the same time.

Afterward, the routing module 120 disconnects the universal input/output channel 130 from the input/output terminal 110_1 and controls the universal input/output channel 130 to connect to the input/output terminal 110_2. At this time, the universal input/output channel 130 may also be the input channel (e.g. the analog input channel or the digital input channel). Then, the input/output channel 410_2 may output the output signal (e.g., the analog output signal or the digital signal) to the field device 150_2 (e.g., the analog actuator or the digital actuator), so as to drive the field device 150_2. Simultaneously, the input/output channel 410_2 may also output the output signal to the universal input/output channel 130, so that the output signal of the input/output channel 410_2 may be diagnosed by the universal input/output channel 130.

The rest of the connections between the universal input/output channel 130 and the input/output terminals 110_3~110_N and the transceiving sequence for the input signals and the output signals may be similar to the embodiment described above, so this description is not repeated herein. The configurable input/output device 400 may achieve the diagnosed and redundant function.

Figure 4F:
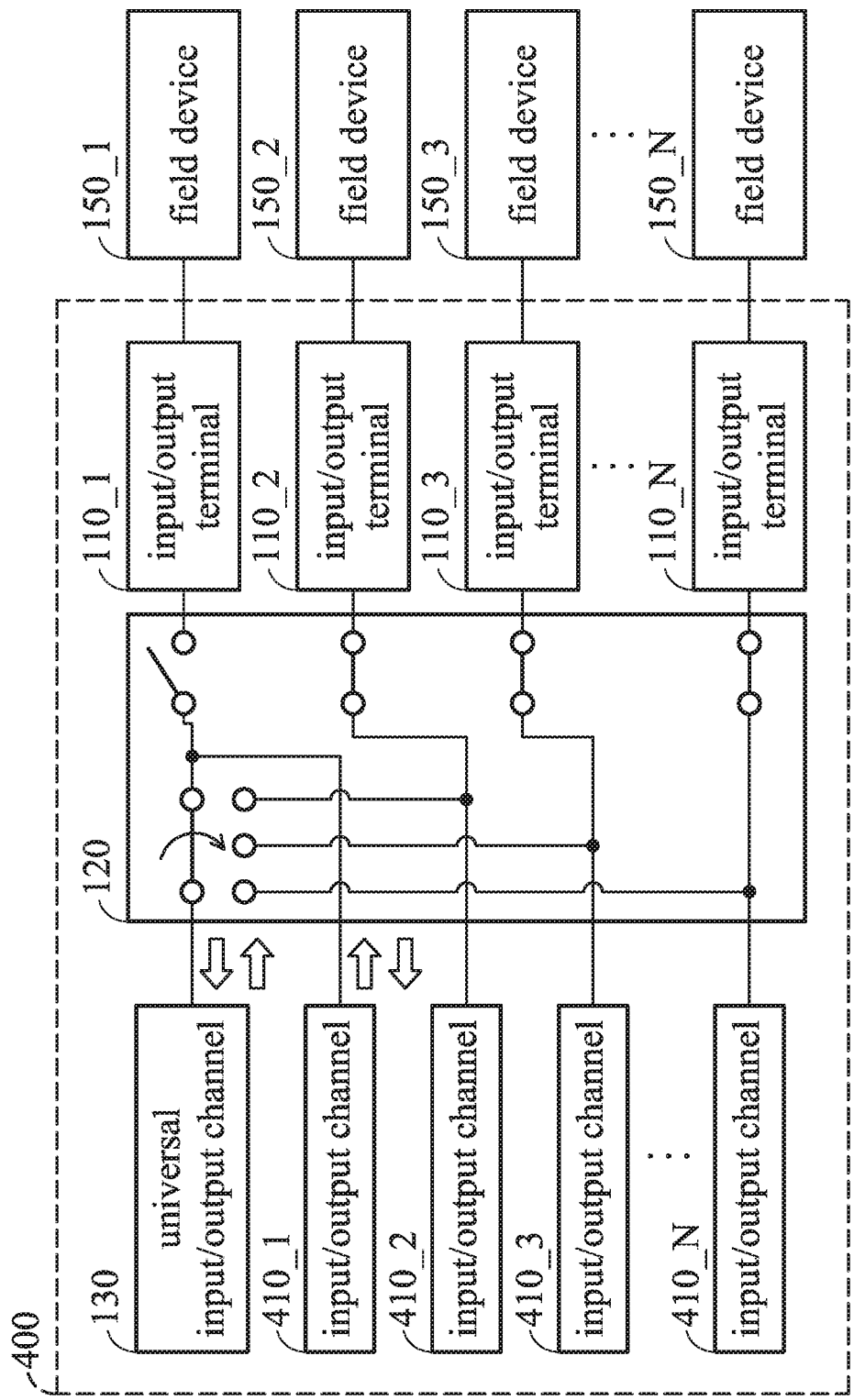
FIG. 4F is a schematic view of a configurable input/output device according to another embodiment of the disclosure.
Figure 4G:
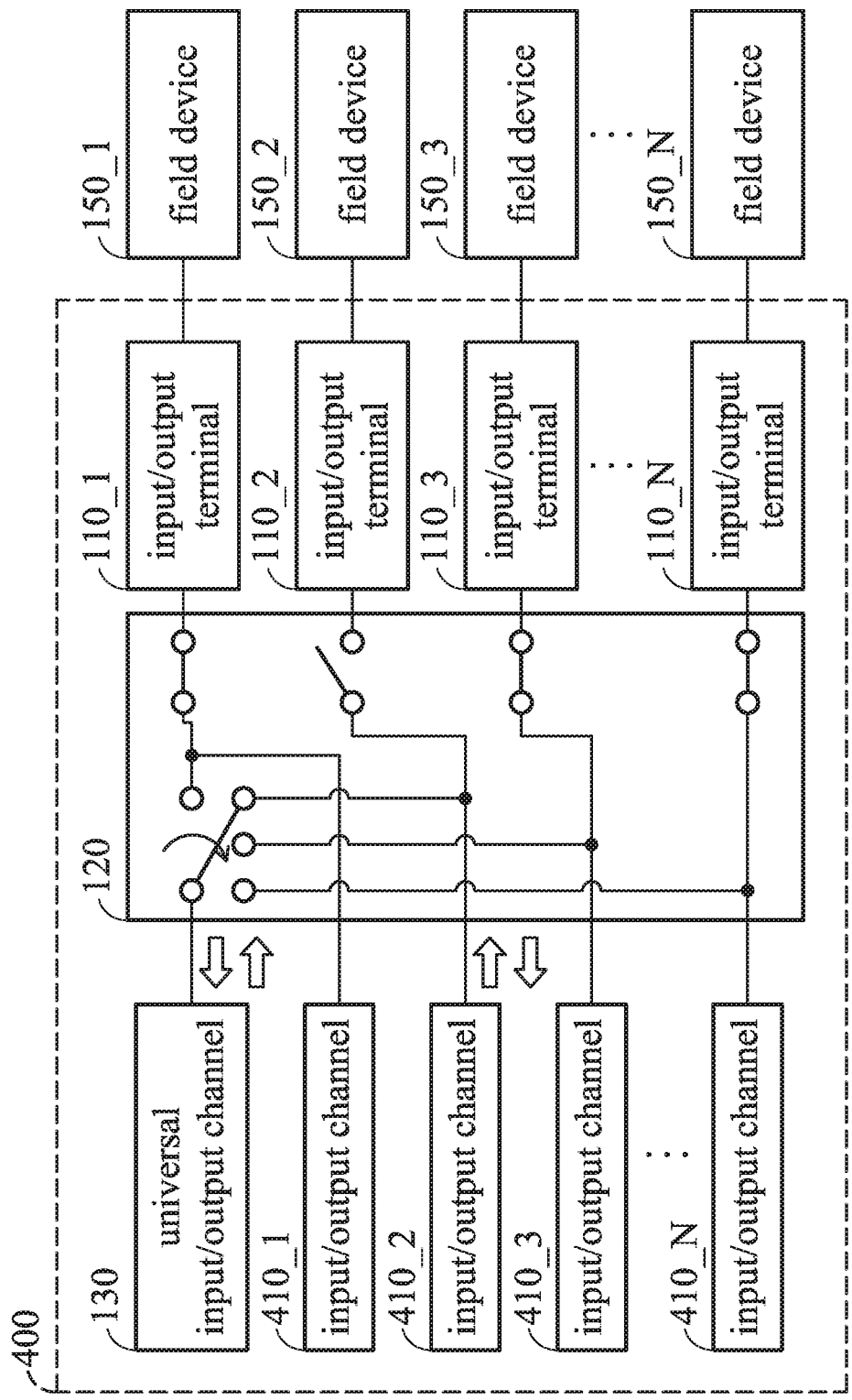
FIG. 4G is a schematic view of a configurable input/output device according to another embodiment of the disclosure.

Please refer to FIG. 4F and FIG. 4G. As shown in FIG. 4F, the routing module 120 controls the universal input/output channel 130 to connect to the input/output channel 410_1 and disconnects the input/output channel 410_1 from the input/output terminal 110_1. At this time, assuming that the input/output channel 410_1 is the input channel (e.g., the analog input channel or the digital input channel), the universal input/output channel 130 may turn to be the output channel (e.g., the analog output channel or the digital output channel). Then, the input/output channel 410_1 may input the input signal (e.g., the analog input signal or the digital input signal) from the universal input/output channel 130, so that the input signal of the input/output channel 410_1 may be diagnosed by the universal input/output channel 130. Alternatively, assuming that the input/output channel 410_1 is the output channel (e.g., the analog output channel or the digital output channel), the universal input/output channel 130 may turn to be the input channel (e.g., the analog input channel or the digital input channel). Then, the universal input/output channel 130 may input the input signal (e.g., the analog input signal or the digital input signal) from the input/output channel 410_1, so that the input signal of the universal input/output channel 130 may be diagnosed by the input/output channel 410_1.

Afterward, as shown in FIG. 4G, the routing module 120 is connected to the input/output terminal 110_1, the routing module 120 controls the universal input/output channel 130 to connect to the input/output channel 410_2 and disconnects the input/output channel 410_2 from the input/output terminal 110_2. At this time, assuming that the input/output channel 410_2 is the input channel (e.g., the analog input channel or the digital input channel), the universal input/output channel 130 may turn to be the output channel (e.g., the analog output channel or the digital output channel). Then, the input/output channel 410_2 may input the input signal (e.g., the analog input signal or the digital input signal) from the universal input/output channel 130, so that the input signal of the input/output channel 410_2 may be diagnosed by the universal input/output channel 130. Alternatively, assuming that the input/output channel 410_2 is the output channel (e.g., the analog output channel or the digital output channel), the universal input/output channel 130 may turn to be the input channel (e.g., the analog input channel or the digital input channel). Then, the universal input/output channel 130 may input the input signal (e.g., the analog input signal or the digital input signal) from the input/output channel 410_2, so that the input signal of the universal input/output channel 130 may be diagnosed by the input/output channel 410_2.

The rest of the connections between the universal input/output channel 130 and the input/output channels 410_3~410_N and the transmission sequence for the output signals may be similar to the embodiment described above in FIG. 4F and FIG. 4G, so this description is not repeated herein. Therefore, one of the input/output channels 410_1~410_N may be diagnosed by the universal input/output channel 130 in case no changes of input status for a long run, so that the configurable input/output device 400 may achieve the diagnosed function.

Figure 5:
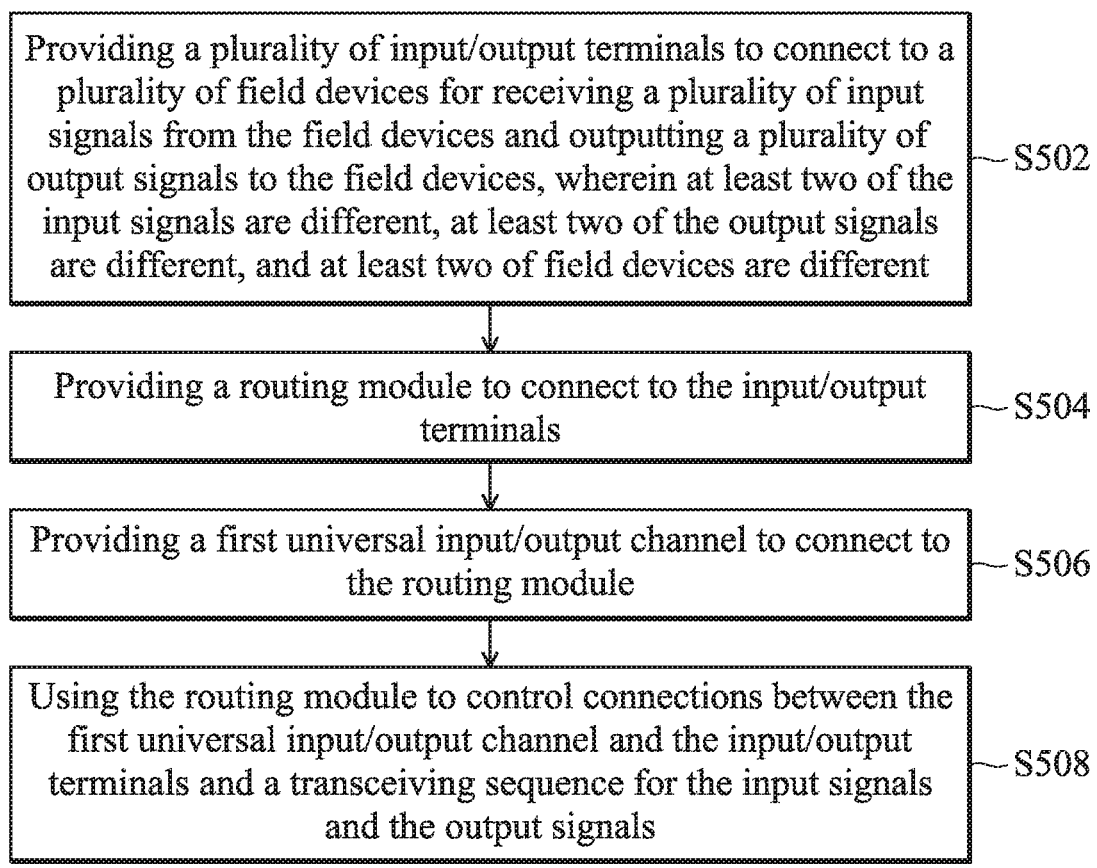
FIG. 5 is a flowchart of an operation method of a configurable input/output device according to an embodiment of the disclosure.

FIG. 5 is a flowchart of an operation method of a configurable input/output device according to an embodiment of the disclosure. In step S502, the method involves providing a plurality of input/output terminals to connect to a plurality of field devices for receiving a plurality of input signals from the field devices and outputting a plurality of output signals to the field devices, wherein at least two of the input signals are different, at least two of the output signals are different, and at least two of field devices are different. In step S504, the method involves providing a routing module to connect to the input/output terminals. In step S506, the method involves providing a first universal input/output channel to connect to the routing module. In step S508, the method involves using the routing module to control connections between the first universal input/output channel and the input/output terminals and a transceiving sequence for the input signals and the output signals. In addition, the routing module includes a switching module and a processing unit, and the step S508 may include using the processing module to receive a setting signal and generate a control signal according to the setting signal to control the switching module and the transceiving sequence for the input signals and the output signals, so that the switching module switches the connections between the first universal input/output channel and the input/output terminals.

Figure 6:
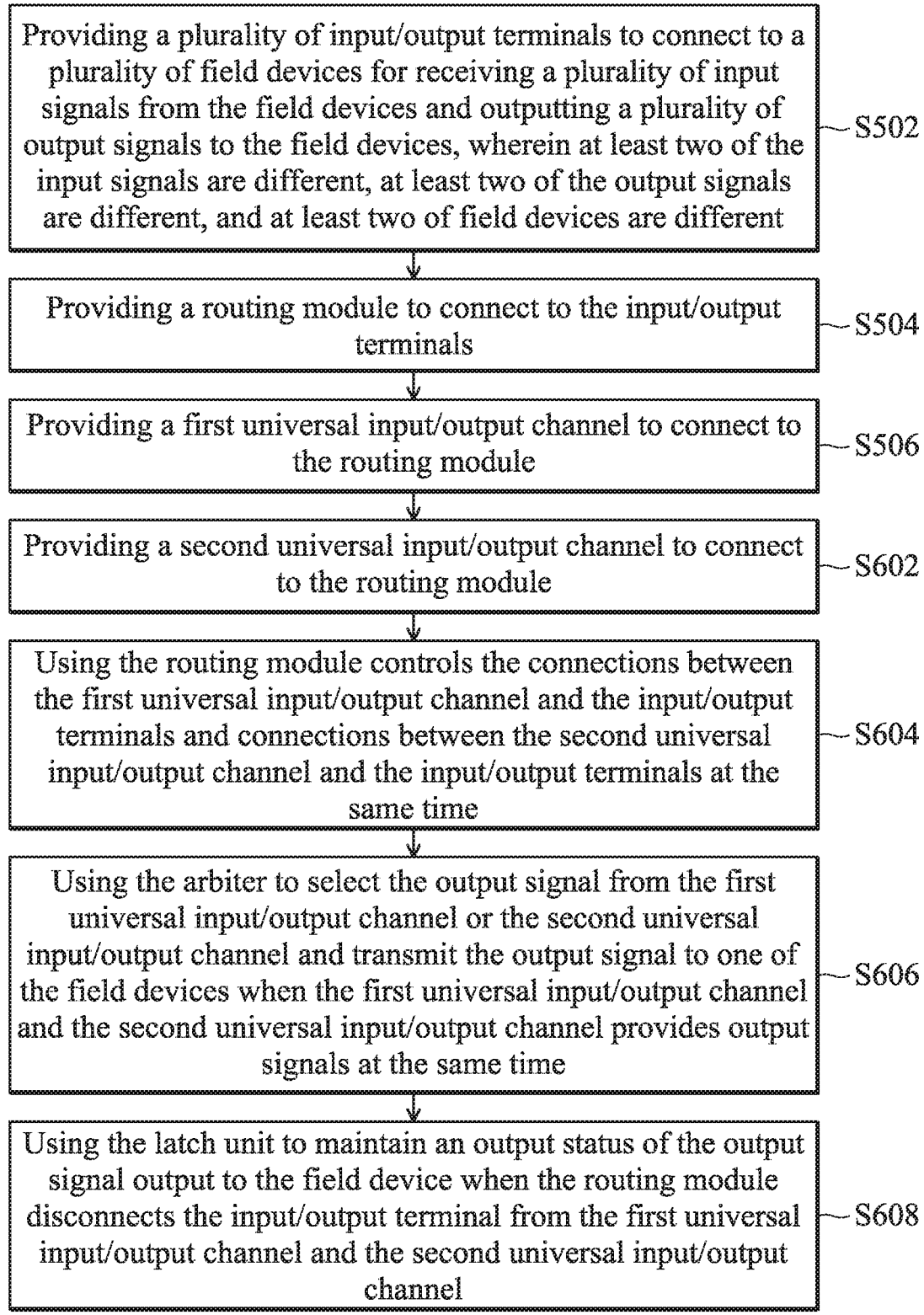
FIG. 6 is a flowchart of an operation method of a configurable input/output device according to another embodiment of the disclosure.

FIG. 6 is a flowchart of an operation method of a configurable input/output device according to another embodiment of the disclosure. In the embodiment, the steps S502~S506 in FIG. 6 are the same as that in FIG. 5, these steps may be described by the embodiment in FIG. 5, and the description thereof is not repeated herein.

In step S602, the method involves providing a second universal input/output channel to connect to the routing module. In step S604, the method involves using the routing module controls the connections between the first universal input/output channel and the input/output terminals and connections between the second universal input/output channel and the input/output terminals at the same time.

In addition, the routing module may further include an arbiter, and FIG. 6 may further include step S606. In step S606, the method involves using the arbiter to select the output signal from the first universal input/output channel or the second universal input/output channel and transmit the output signal to one of the field devices when the first universal input/output channel and the second universal input/output channel provides output signals at the same time. Furthermore, each of the input/output terminals may further include a latch unit and FIG. 6 may further include step S608. In step S608, the method involves using the latch unit to maintain an output status of the output signal output to the field device when the routing module disconnects the input/output terminal from the first universal input/output channel and the second universal input/output channel.

Figure 7:
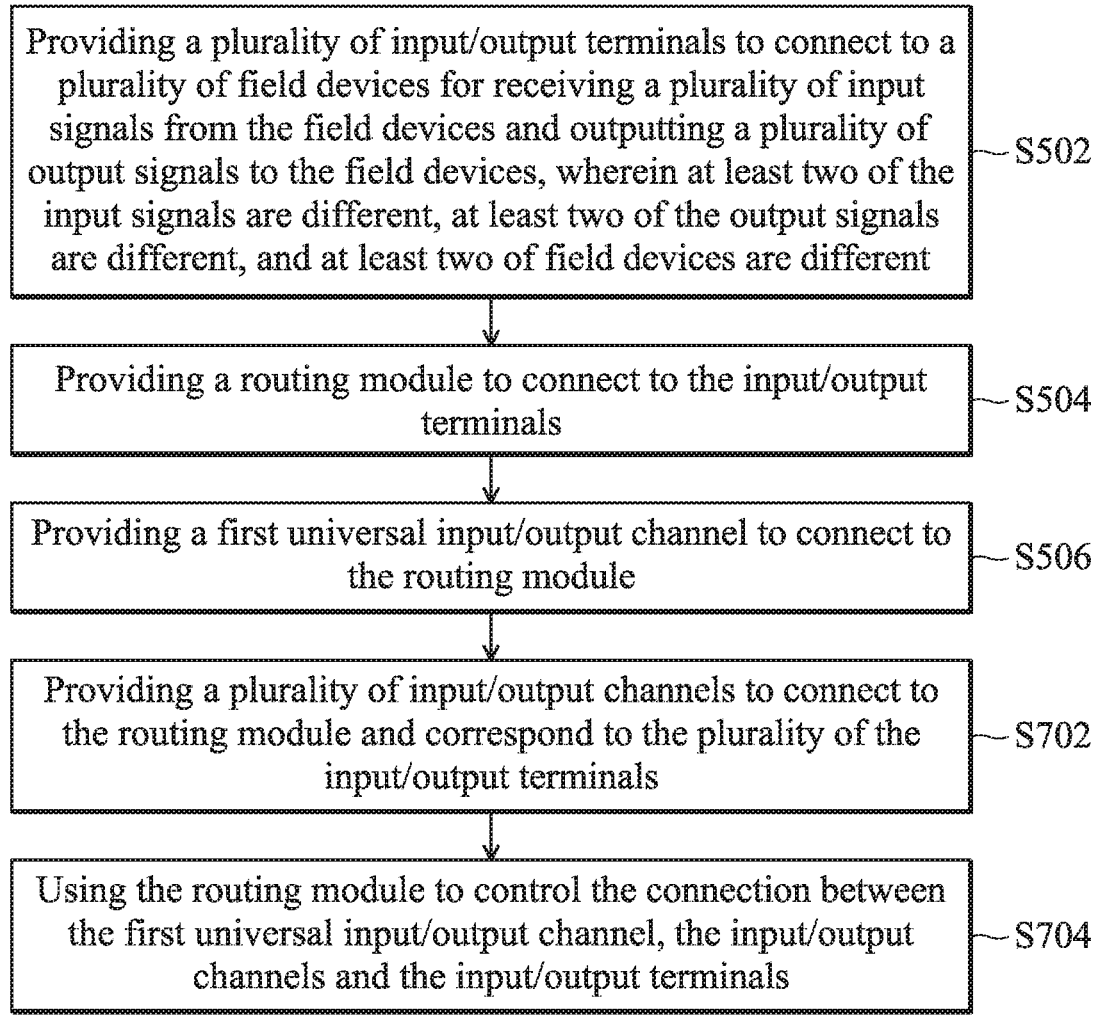
FIG. 7 is a flowchart of an operation method of a configurable input/output device according to another embodiment of the disclosure.

FIG. 7 is a flowchart of an operation method of a configurable input/output device according to another embodiment of the disclosure. In the embodiment, the steps S502~S506 in FIG. 7 are the same as that in FIG. 5, these steps may be described by the embodiment in FIG. 5, and the description thereof is not repeated herein.

In step S702, the method involves providing a plurality of input/output channels to connect to the routing module and correspond to the plurality of the input/output terminals. In step S704, the method involves using the routing module to control the connection between the first universal input/output channel, the input/output channels and the input/output terminals.

It should be noted that the order of the steps of FIG. 5, FIG. 6 and FIG. 7 is only for illustrative purpose, but not intended to limit the order of the steps of the present disclosure. The user may change the order of the steps above according the requirement thereof. The flowcharts described above may add additional steps or use fewer steps without departing from the spirit and scope of the present disclosure.

In summary, according to the configurable input/output device and the operation method thereof disclosed by the disclosure, the input/output terminals are connected the field devices, receive the input signals from the field devices and output the output signals to the field devices, the routing module is connected between the first universal input/output channel, and the routing module may control connections between the first universal input/output channel and the input/output terminals and the transceiving sequence for the input signals and the output signals. Therefore, the configurable input/output device may be connected to various types of the field devices through the input/output terminals at the same, and the input/output terminals (the filed devices) may share the same universal input/output channel to transmit the input signals or the output signals, thereby decreasing the complexity of the circuit design and increasing the convenience of use.

In addition, in one embodiment, the configurable input/output device may further includes the second universal input/output channel, and the first universal input/output channel and the second universal input/output channel may transmit the same types of the input signals or the output signals at the same time, so that the configurable input/output device may achieve the redundant function, and the cost of the redundancy may be effectively reduced. Alternatively, in another embodiment, the configurable input/output device may further includes the input/output channels, and the routing module controls the connection between the first universal input/output channel and the input/output channels or the routing module further controls the connections between the first universal input/output channel and the input/output terminals and connections between the input/output terminals and the input/output channels at the same time, so that the configurable input/output device may also achieve the diagnosed and/or redundant function, and the cost of the redundancy may be effectively reduced.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A configurable input/output device, comprising:
a plurality of input/output terminals, connected to a plurality of field devices, receiving a plurality of input signals from the field devices, and outputting a plurality of output signals to the field devices, wherein at least two of the input signals are different, at least two of the output signals are different, and at least two of field devices are different;
a routing module, connected to the input/output terminals;
a first universal input/output channel, connected to the routing module, wherein the first universal input/output channel includes a function of digital to analog conversion and analog to digital conversion; and
an input/output channel, connected to the routing module, wherein the routing module controls a connection between the first universal input/output channel, the input/output channel and the input/output terminals;
wherein the routing module controls connections between the first universal input/output channel and the input/output terminals and a transceiving sequence for the input signals and the output signals;
wherein the routing module performs:
controlling one of the plurality of input signals transmitted to the universal input/output channel and the input/output channel at the same time; and
controlling the first universal input/output channel to be an output channel, the input/output channel to be an input channel, so that the first universal input/output channel outputs an output signal to the input/output channel, and the output signal of the first universal input/output channel is diagnosed by the input/output channel.

2. The configurable input/output device as claimed in claim 1, wherein the routing module comprises:
a switching module, connected to the first universal input/output channel and the input/output terminals; and
a processing module, connected to the switching module;
wherein the processing module receives a setting signal and generates a control signal according to the setting signal to control the switching module and the transceiving sequence for the input signals and the output signals, so that the switching module switches the connections between the first universal input/output channel and the input/output terminals.

3. The configurable input/output device as claimed in claim 2, wherein the processing module disconnects the switching module from the first universal input/output channel, the processing module connects to the first universal input/output channel, the processing module receives the setting signal from the first universal input/output channel, the processing module disconnects from the first universal input/output channel, and the processing module generates the control signal according to the setting signal to control the switching module, so that the switching module switches the connections between the first universal input/output channel and the input/output terminals, and the input signals and the output signals are sequentially transceived through the first universal input/output channel, the switching module, and the input/output terminals.

4. The configurable input/output device as claimed in claim 1 wherein the input/output channel is a second universal input/output channel.

5. The configurable input/output device as claimed in claim 1, wherein the first universal input/output channel and the input/output channel provides output signals at the same time, and the routing module further comprises:
an arbiter, selecting the output signal from the first universal input/output channel or the input/output channel and transmit the output signal to one of the field devices.

6. The configurable input/output device as claimed in claim 5, wherein each of the input/output terminals comprises:
a latch unit, maintaining an output status of the output signal output to the field device when the routing module disconnects the input/output terminal from the first universal input/output channel and the input/output channel.

7. An operation method of a configurable input/output device, comprising:
providing a plurality of input/output terminals to connect to a plurality of field devices for receiving a plurality of input signals from the field devices and outputting a plurality of output signals to the field devices, wherein at least two of the input signals are different, at least two of the output signals are different, and at least two of field devices are different;
providing a routing module to connect to the input/output terminals;
providing a first universal input/output channel to connect to the routing module, wherein the first universal input/output channel includes a function of digital to analog conversion and analog to digital conversion;
providing an input/output channel to connected to the routing module, wherein the routing module controls a connection between the first universal input/output channel, the input/output channel and the input/output terminals;
using the routing module to control connections between the first universal input/output channel and the input/output terminals and a transceiving sequence for the input signals and the output signals, wherein the routing module performs:
controlling one of the plurality of input signals transmitted to the universal input/output channel and the input/output channel at the same time; and
controlling the first universal input/output channel to be an output channel, the input/output channel to be an input channel, so that the first universal input/output channel outputs an output signal to the input/output channel, and the output signal of the first universal input/output channel is diagnosed by the input/output channel.

8. The operation method of the configurable input/output device as claimed in claim 7, wherein the routing module comprises a switching module and a processing unit, and the step of using the routing module to control connections between the first universal input/output channel and the input/output terminals and the transceiving sequence for the input signals and the output signals comprises:
using the processing module to receive a setting signal and generate a control signal according to the setting signal to control the switching module and the transceiving sequence for the input signals and the output signals, so that the switching module switches the connections between the first universal input/output channel and the input/output terminals.

9. The operation method of the configurable input/output device as claimed in claim 8, wherein the processing module disconnects the switching module from the first universal input/output channel, the processing module connects to the first universal input/output channel, the processing module receives the setting signal from the first universal input/output channel, the processing module disconnects from the first universal input/output channel, and the processing module generates the control signal according to the setting signal to control the switching module, so that the switching module switches the connections between the first universal input/output channel and the input/output terminals, and the input signals and the output signals are sequentially transceived through the first universal input/output channel, the switching module, and the input/output terminals.

10. The operation method of the configurable input/output device as claimed in claim 7,
wherein the input/output channel is a second universal input/output channel.

11. The operation method of the configurable input/output device as claimed in claim 7, wherein the routing module further comprises an arbiter, and the operation method further comprises:
using the arbiter to select the output signal from the first universal input/output channel or the input/output channel and transmit the output signal to one of the field devices when the first universal input/output channel and the input/output channel provides output signals at the same time.

12. The operation method of the configurable input/output device as claimed in claim 11, the wherein each of the input/output terminals comprises a latch unit, and the operation method further comprises:
using the latch unit to maintain an output status of the output signal output to the field device when the routing module disconnects the input/output terminal from the first universal input/output channel and the input/output channel.

* * * * *